US007971131B1

(12) United States Patent
Ordentilch et al.

(10) Patent No.: US 7,971,131 B1
(45) Date of Patent: *Jun. 28, 2011

(54) SYSTEM AND METHOD FOR ITERATIVE DENOISING AND ERROR CORRECTION DECODING

(75) Inventors: Erik Ordentilch, San Jose, CA (US); Gadiel Seroussi, Cupertino, CA (US); Krishnamurthy Vlswanathan, Sunnyvale, CA (US); Sergio Verdu, Princeton, NJ (US); Itschak (Tsachy) Weissman, Menlo Park, CA (US); Marcelo Weinberger, San Jose, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 1336 days.

This patent is subject to a terminal disclaimer.

(21) Appl. No.: 11/166,895

(22) Filed: Jun. 24, 2005

Related U.S. Application Data

(63) Continuation-in-part of application No. 11/123,561, filed on May 6, 2005, now Pat. No. 7,434,146.

(51) Int. Cl.
 *H03M 13/03* (2006.01)
(52) U.S. Cl. ...................................................... 714/786
(58) Field of Classification Search .................. 714/786
 See application file for complete search history.

(56) References Cited

U.S. PATENT DOCUMENTS

| | | | |
|---|---|---|---|
| 4,831,624 A * | 5/1989 | McLaughlin et al. | 714/781 |
| 5,054,025 A * | 10/1991 | Galand et al. | 714/800 |
| 5,406,570 A | 4/1995 | Berrou et al. | |
| 5,742,678 A * | 4/1998 | Dent et al. | 380/270 |
| 5,920,599 A | 7/1999 | Igarashi | |
| 5,968,198 A | 10/1999 | Hassan et al. | |
| 6,484,283 B2 * | 11/2002 | Stephen et al. | 714/786 |
| 6,499,128 B1 | 12/2002 | Gerlach et al. | |
| 6,522,696 B1 * | 2/2003 | Mobin et al. | 375/262 |
| 6,530,059 B1 * | 3/2003 | Crozier et al. | 714/786 |
| 6,654,926 B1 | 11/2003 | Raphaelie et al. | |
| 6,738,941 B1 | 5/2004 | Todoroki | |
| 7,568,147 B2 * | 7/2009 | Eidson et al. | 714/786 |
| 2005/0097421 A1 | 5/2005 | Weissman et al. | |
| 2006/0190181 A1 * | 8/2006 | Deffenbaugh et al. | 702/14 |
| 2008/0072123 A1 * | 3/2008 | Eidson et al. | 714/786 |

OTHER PUBLICATIONS

Ma Dawei, A Reliable Data Transmission Scheme under Wireless Condition, 2002 3rd edition, 245-248.*
Rainer Bauer et al., Symbol-by-Symbol MAP Decoding of Variable Length Codes, Jan. 2000, Munich, Germany.

(Continued)

*Primary Examiner* — Scott T Baderman
*Assistant Examiner* — Enam Ahmed

(57) ABSTRACT

Systems and methods for iterative denoising and error correction decoding are presented. In an embodiment, a system iteratively processes a noisy signal formed by a noise-introducing channel in response to an error correction coded input signal. A denoiser generates reliability information for symbols in the input signal. The reliability information is generated by forming a product of received reliability information and an estimate of the distribution of metasymbols in the input signal, each metasymbol includes context symbols and a corresponding input symbol, and summing over values for the context symbols corresponding to the particular input symbol. An error correction decoder performs error correction decoding using the generated reliability information. In another embodiment, the reliability information is generated by forming a hard-decision decoded signal from received reliability information, determining metasymbol counts from the hard-decision decoded signal and solving an equation whose coefficients are obtained from the received reliability information and the metasymbol counts.

38 Claims, 12 Drawing Sheets

OTHER PUBLICATIONS

Rainer Bauer et al., Iterative Source/Channel-Decoding Using Reversible Variable Length Codes, Mar. 2000, Munich, Germany.

Rainer Bauer et al., On Variable Length Codes for Iterative Source/Channel Decoding, Mar. 2001, Munich, Germany.

Claude Berrou et al., Near Shannon Limit Error—Correcting Coding and Decoding : Turbo-Codes, Proceeding of the IEEE International Conference on Communications, 1993, (2):1064-1070, IEEE, New York, NY.

Maja Bystrom et al., Soft Source Decoding With Applications, IEEE Transactions on Circuits and Systems for Video Technology, 2001, 11(10):1108-1120, Oct. 2001, IEEE, New York, NY.

Giuseppe Caire et al., Almost-Noiseless Joint Source-Channel Coding-Decoding of Sources with Memory, 2004, Sophia Antipolis, France.

Amir Dembo et al., Universal Denoising for the Finite-Input-General-Output Channel, May 8, 2004, Stanford, CA.

Amir Dembo et al., Universal Denoising for the Finite-Input-General-Output Channel, Proceedings of International Symposium on Information Theory, Jun. 27, 2004, p. 199, IEEE, New York, NY.

Tim Fingscheidt et al., Combined Source/Channel Decoding: When Minimizing Bit Error Rate is Suboptimal, Jan. 2000, Munich, Germany.

Javier Garcia-Frias et al., Combining Hidden Markov Source Models and Parallel Concatenated Codes, IEEE Communications Letters, 1997, 1(4):111-113, IEEE, New York, NY.

Javier Garcia-Frias et al., Joint Source-Channel Decoding of Correlated Sources over Noisy Channels, Proceedings of the Data Compression Conference, Mar. 2001, pp. 283-292, IEEE Computer Society, Washington D.C.

Javier Garcia-Frias et al., Joint Turbo Decoding and Estimation of Hidden Markov Sources, IEEE Journal on Selected Areas in Communications, Sep. 2001, 19(9):1671-1679, IEEE, New York, NY.

Norbert Görtz, Iterative Source-Channel Decoding using Soft-In/Soft-Out Decoders, Proceedings IEEE International Symposium on Information Theory, Jun. 2000, p. 173, IEEE New York, NY.

Norbert Görtz, On the Iterative Approximation of Optimal Joint Source-Channel Decoding, IEEE Journal on Selected Areas in Communications, Sep. 2001, 19(9):1662-1670, IEEE, New York, NY.

N. Görtz, A Generalized Framework for Iterative Source-Channel Decoding, Turbo Codes: Error-Correcting Codes of Widening Application (Ed. Michel Jézéquel et al.), May 2002, pp. 105-126, Kogan Page Science, London UK.

Joachim Hagenauer, Source-Controlled Channel Decoding, IEEE Transactions on Communications, 1995, 43(9):2449-2457, IEEE, New York, NY.

T. Hindelang et al., Combined Source/Channel (De-)Coding: Can A Priori Information Be Used Twice?, IEEE International Conference on Communications, Jun. 2000, (3):1208-1212, IEEE, New York, NY.

Thomas Hindelang et al., Source-Controlled Channel Decoding: Estimation of Correlated Parameters, 2000, Munich, Germany.

Ksenija Lakovic et al., Parallel Concatenated Codes for Iterative Source-Channel Decoding, Oct. 2001, Los Angeles, CA.

Erik Ordentlich et al., Channel Decoding of Systematically Encoded Unknown Redundant Sources, Proceedings of International Symposium on Information Theory, Jun. 27, 2004, p. 163, IEEE, New York, NY.

Erik Ordentlich et al., Channel Decoding of Systematically Encoded Unknown Redundant Sources, Slide Presentation, 2004 IEEE International Symposium on Information Theory, Jun. 29, 2004, Chicago, IL.

Tsachy Weissman et al., Universal Discrete Denoising, Proceedings of the 2002 IEEE Information Theory Workshop, Oct. 2002, pp. 11-14, IEEE, New York, NY.

Tsachy Weissman et al., Universal Discrete Denoising: Known Channel, HP Labs: Tech Report: HPL-2003-29, Feb. 24, 2003, Hewlett-Packard, Palo Alto, CA.

Tsachy Weissman et al., U.S. Appl. No. 10/876,958, filed Jun. 25, 2004.

Tsachy Weissman et al., U.S. Appl. No. 10/887,933, filed Jun. 25, 2004.

Erik Ordentlich et al., U.S. Appl. No. 10/933,643, filed Sep. 2, 2004.

Sergio Verdu et al., U.S. Appl. No. 11/123,561, filed May 6, 2005.

Amir Dembo et al., Universal Denoising for the Finite-Input, General-Output Channel, IEEE Transactions on Information Theory, Apr. 2005, 51(4):1507-1517, IEEE, New York, NY.

Gil I. Shamir et al., Context Decoding of Low Density Parity Check Codes, 2005 Conference on Information Sciences and Systems, Mar. 16-18, 2005, The John Hopkins University, Baltimore MD.

* cited by examiner

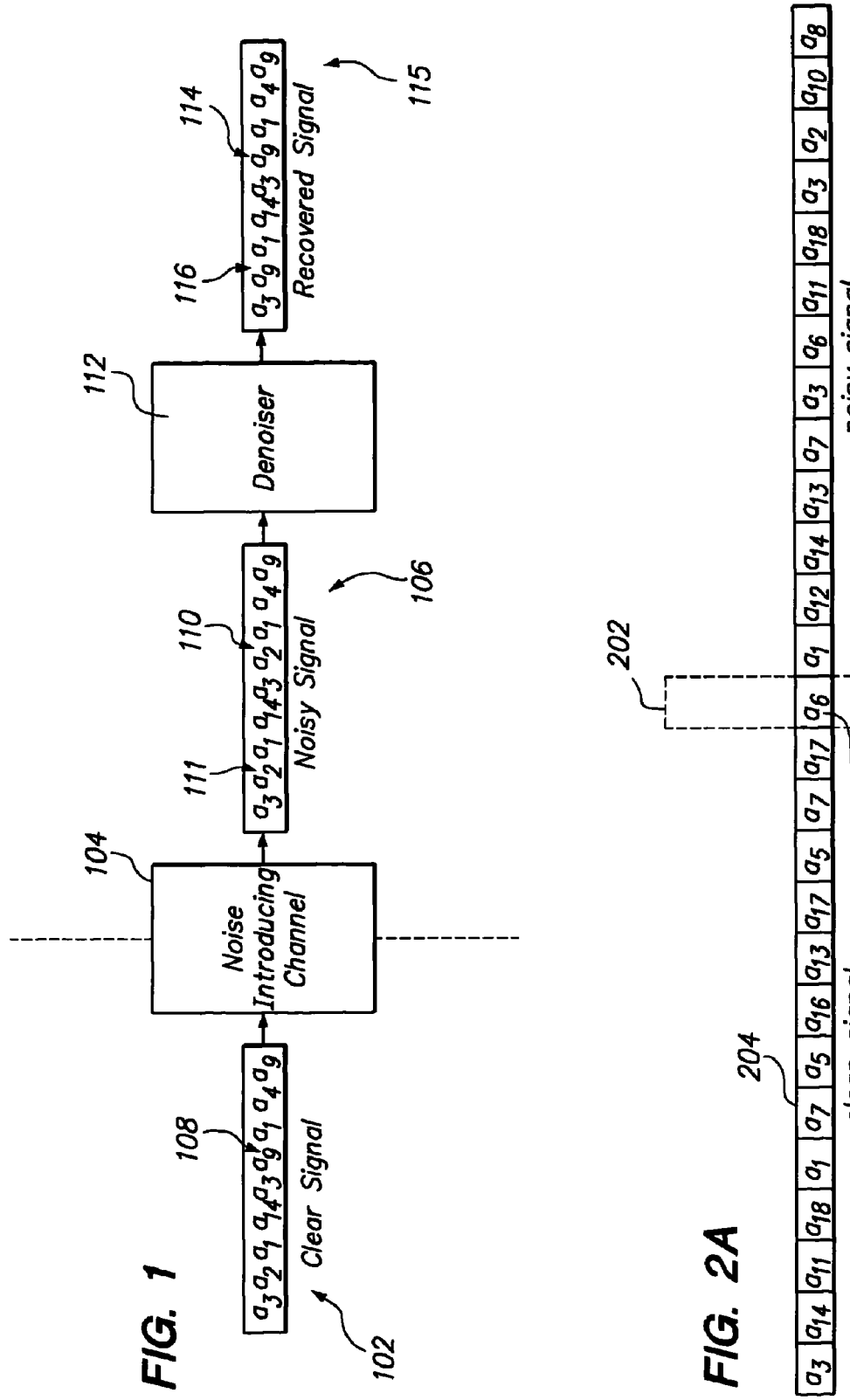

$$\begin{bmatrix} \pi_1 & \pi_2 & \pi_3 & \cdots & \pi_n \\ p_{a_1 \to a_1} & p_{a_1 \to a_2} & p_{a_1 \to a_3} & \cdots & p_{a_1 \to a_n} \\ p_{a_2 \to a_1} & p_{a_2 \to a_2} & p_{a_2 \to a_3} & \cdots & p_{a_2 \to a_n} \\ p_{a_3 \to a_1} & p_{a_3 \to a_2} & p_{a_3 \to a_3} & \cdots & p_{a_3 \to a_n} \\ \vdots & \vdots & \vdots & & \vdots \\ p_{a_n \to a_1} & p_{a_n \to a_2} & p_{a_n \to a_3} & \cdots & p_{a_n \to a_n} \end{bmatrix} \leftarrow 216$$

$$\begin{bmatrix} m[a_1]^{clean}, m[a_2]^{clean}, \ldots, m[a_n]^{clean} \end{bmatrix} \times \begin{bmatrix} p_{a_1 \to a_1}, p_{a_1 \to a_2}, \ldots, p_{a_1 \to a_n} \\ p_{a_2 \to a_1}, p_{a_2 \to a_2}, \ldots, p_{a_2 \to a_n} \\ \vdots \\ p_{a_n \to a_1}, p_{a_n \to a_2}, \ldots, p_{a_n \to a_n} \end{bmatrix} \cong \begin{bmatrix} m[a_1]^{noisy}, m[a_2]^{noisy}, \ldots, m[a_n]^{noisy} \end{bmatrix}$$

218          222

$$m[a_1]^{clean} p_{a_1 \to a_1} + m[a_2]^{clean} p_{a_2 \to a_1} + m[a_3]^{clean} p_{a_3 \to a_1}, \ldots, + m[a_n]^{clean} p_{a_n \to a_1} \cong m[a_1]^{noisy}$$

$$m[a_1]^{clean} p_{a_1 \to a_2} + m[a_2]^{clean} p_{a_2 \to a_2} + m[a_3]^{clean} p_{a_3 \to a_2}, \ldots, + m[a_n]^{clean} p_{a_n \to a_2} \cong m[a_2]^{noisy}$$

$$\vdots$$

$$m[a_1]^{clean} p_{a_1 \to a_n} + m[a_2]^{clean} p_{a_2 \to a_n} + m[a_3]^{clean} p_{a_3 \to a_n}, \ldots, + m[a_n]^{clean} p_{a_n \to a_n} \cong m[a_n]^{noisy}$$

FIG. 6

$$\begin{bmatrix} d_{a_1 \to a_x} \\ d_{a_2 \to a_x} \\ \vdots \\ d_{a_n \to a_x} \end{bmatrix} \odot \begin{bmatrix} p_{a_1 \to a_\alpha} \\ p_{a_2 \to a_\alpha} \\ p_{a_3 \to a_\alpha} \\ \vdots \\ p_{a_n \to a_\alpha} \end{bmatrix} = \begin{bmatrix} d_{a_1 \to a_x} \; p_{a_1 \to a_\alpha} \\ d_{a_2 \to a_x} \; p_{a_2 \to a_\alpha} \\ d_{a_3 \to a_x} \; p_{a_3 \to a_\alpha} \\ \vdots \\ d_{a_n \to a_x} \; p_{a_n \to a_\alpha} \end{bmatrix}$$

$\lambda_{a_x} \qquad\qquad \pi_{a_\alpha} \qquad\qquad \lambda_{a_x} \odot \pi_{a_\alpha}$

FIG. 7

$\underbrace{\boxed{\phantom{xxxxxx}}}_{q^T(s_{noisy}, s_{clean}, b, c)} \times \underbrace{\begin{bmatrix} \phantom{xx} \\ \phantom{xx} \\ \phantom{xx} \end{bmatrix}}_{\lambda_{a_x} \odot \pi_{a_\alpha}}$ = distortion expected for replacing $a_\alpha$ in $ba_\alpha c$ in $s_{noisy}$ by $a_x$

FIG. 8

$\underbrace{\boxed{361\;|\;7\;|\;321\;|\;14\;|\;81\;|\cdots|\;25}}_{m^T(s_{noisy}, b, c)} \times \begin{bmatrix} \Pi^{-1} \end{bmatrix} \cong \underbrace{\boxed{325\;|\;18\;|\;340\;|\;16\;|\;41\;|\cdots|\;30}}_{q^T(s_{noisy}, s_{clean}, b, c)}$

FIG. 10

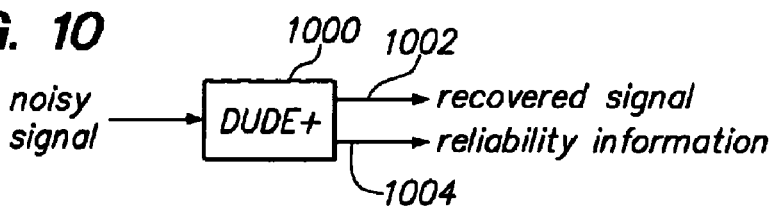

FIG. 11

$$(m^T(s_{noisy\_1},b,c)\Pi^{-1})[a_x]\Pi(a_x,a_3); \quad x=1,2,\cdots,n$$

| | | |
|---|---|---|
| $a_1$ | $(m^T(s_{noisy\_1},b,c)\Pi^{-1})[a_1]\Pi(a_1,a_3)=1$ | 0.28% |
| $a_2$ | $(m^T(s_{noisy\_1},b,c)\Pi^{-1})[a_2]\Pi(a_2,a_3)=7$ | 1.9% |
| $a_3$ | $(m^T(s_{noisy\_1},b,c)\Pi^{-1})[a_3]\Pi(a_3,a_3)=289$ | 80% |
| $a_4$ | $(m^T(s_{noisy\_1},b,c)\Pi^{-1})[a_4]\Pi(a_4,a_3)=2$ | 0.55% |
| $a_5$ | $(m^T(s_{noisy\_1},b,c)\Pi^{-1})[a_5]\Pi(a_5,a_3)=6$ | 1.7% |
| $a_6$ | $(m^T(s_{noisy\_1},b,c)\Pi^{-1})[a_6]\Pi(a_6,a_3)=3$ | 0.83% |
| $a_7$ | $(m^T(s_{noisy\_1},b,c)\Pi^{-1})[a_7]\Pi(a_7,a_3)=4$ | 1.1% |
| $a_8$ | $(m^T(s_{noisy\_1},b,c)\Pi^{-1})[a_8]\Pi(a_8,a_3)=1$ | 0.28% |
| $a_9$ | $(m^T(s_{noisy\_1},b,c)\Pi^{-1})[a_9]\Pi(a_9,a_3)=2$ | 0.55% |
| $a_{10}$ | $(m^T(s_{noisy\_1},b,c)\Pi^{-1})[a_{10}]\Pi(a_{10},a_3)=5$ | 1.4% |
| $a_{11}$ | $(m^T(s_{noisy\_1},b,c)\Pi^{-1})[a_{11}]\Pi(a_{11},a_3)=7$ | 1.9% |
| $a_{12}$ | $(m^T(s_{noisy\_1},b,c)\Pi^{-1})[a_{12}]\Pi(a_{12},a_3)=8$ | 2.2% |
| $a_{13}$ | $(m^T(s_{noisy\_1},b,c)\Pi^{-1})[a_{13}]\Pi(a_{13},a_3)=4$ | 1.1% |
| $a_{14}$ | $(m^T(s_{noisy\_1},b,c)\Pi^{-1})[a_{14}]\Pi(a_{14},a_3)=11$ | 3.0% |
| $a_{15}$ | $(m^T(s_{noisy\_1},b,c)\Pi^{-1})[a_{15}]\Pi(a_{15},a_3)=2$ | 0.55% |
| $a_n$ | $(m^T(s_{noisy\_1},b,c)\Pi^{-1})[a_n]\Pi(a_n,a_3)=9$ | 2.5% |

_US 7,971,131 B1_

SYSTEM AND METHOD FOR ITERATIVE DENOISING AND ERROR CORRECTION DECODING

This application is a continuation-in-part of U.S. patent application Ser. No. 11/123,561, filed May 6, 2005 now U.S. Pat. No. 7,434,146, the entire contents of which are hereby incorporated by reference.

FIELD OF THE INVENTION

The present invention is related to methods and systems for denoising noisy signals received from noise-introducing channels.

BACKGROUND OF THE INVENTION

A large body of mathematical and computational techniques has been developed in the area of reliable signal transmission through noise-introducing channels. These different techniques depend on assumptions made with regard to the noise-introducing channel, as well as on the amount and nature of information available, during denoising, regarding the original signal. The denoising process may be characterized by various computational efficiencies, including the time complexity and working-data-set complexity for a particular computational method, as well as by the amount of distortion, or noise, remaining in a recovered signal following denoising with respect to the originally transmitted, clean signal.

Although methods and systems for denoising noisy signals have been extensively studied, and signal denoising is a relatively mature field, developers, vendors, and users of denoising methods and systems, and of products that rely on denoising, continue to recognize the need for improved denoising techniques.

SUMMARY OF THE INVENTION

The present invention comprises systems and methods for iterative denoising and error correction decoding. In an embodiment, a system is provided for iteratively processing a noisy signal formed by a noise-introducing channel in response to an error correction coded input signal. The system includes a denoiser and an error correction decoder. The denoiser generates reliability information for symbols in the input signal. The reliability information is generated for a particular input symbol by forming a product of received reliability information and an estimate of the distribution of metasymbols in the input signal, each metasymbol includes context symbols and a corresponding symbol, and summing over values for the context symbols corresponding to the particular input symbol. The error correction decoder performs error correction decoding using the generated reliability information.

In accordance with another embodiment, a system is provided for iteratively processing a noisy signal formed by a noise-introducing channel in response to an error correction coded input signal. The system includes a denoiser and an error correction decoder. The denoiser generates reliability information for symbols in the input signal. The reliability information is generated by forming a hard-decision decoded signal from received reliability information, determining metasymbol counts for the hard-decision decoded signal and solving an equation whose coefficients are obtained from the received reliability information and the metasymbol counts. The error correction decoder performs error correction decoding using the generated reliability information.

These and other aspects of the invention are described in more detail herein.

BRIEF DESCRIPTION OF THE DRAWINGS

FIG. 1 illustrates introduction of noise into a clean signal to produce a noisy signal and subsequent denoising of the noisy signal to produce a recovered signal;

FIGS. 2A-D illustrate a motivation for a discrete, universal denoiser related to characteristics of the noise-introducing channel;

FIG. 6 illustrates computation of the relative distortion expected from replacing a symbol "$a_\alpha$" in a received, noisy signal by the symbol "$a_x$";

FIG. 7 illustrates use of the column vector $\lambda_{a_x} \odot \pi_{a_\alpha}$ to compute a distortion expected for replacing the center symbol $a_\alpha$ in the metasymbol $ba_\alpha c$ in a noisy signal "$s_{noisy}$" by the replacement symbol $a_x$;

FIG. 8 shows estimation of the counts of the occurrences of symbols "$a_1$"-"$a_n$" for the clean signal;

FIG. 10 illustrates a system in accordance with an embodiment of the present invention for generating a recovered, less-noisy signal and for generating reliability information;

FIG. 11 illustrates an estimated conditional distribution and probabilities in accordance with an embodiment of the present invention;

DETAILED DESCRIPTION OF A PREFERRED EMBODIMENT

Dude

Figures 2B, 2C:
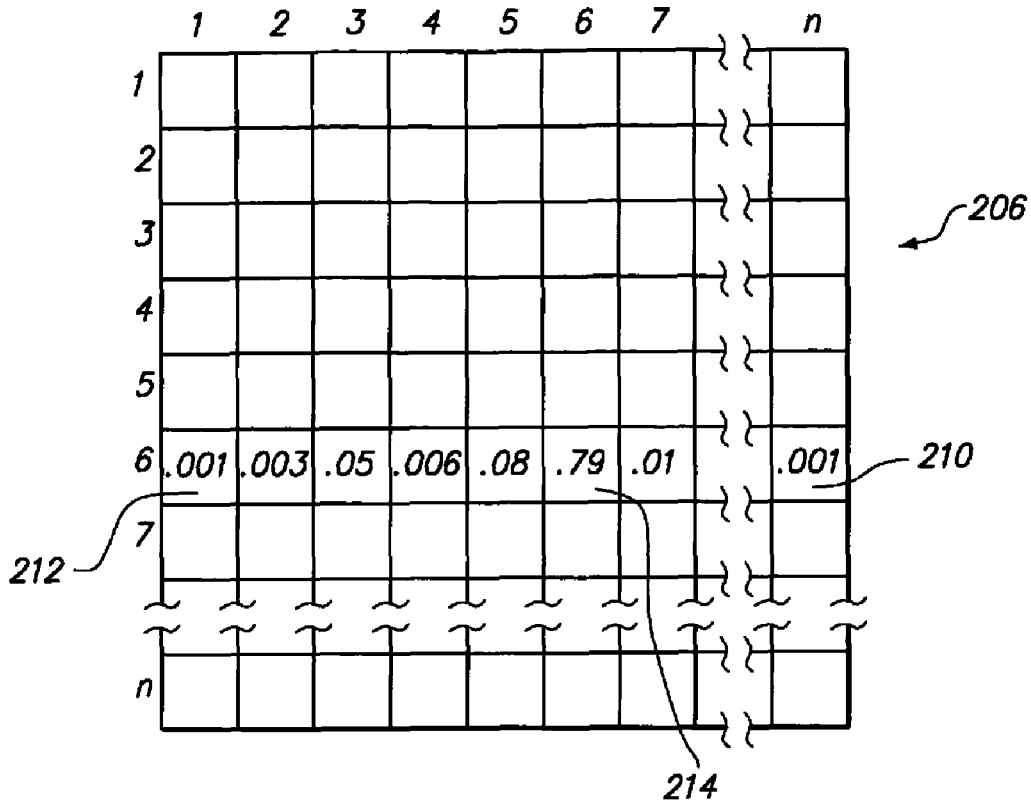

FIG. 1 illustrates introduction of noise into a clean signal to produce a noisy signal and subsequent denoising of the noisy signal to produce a recovered signal. In FIG. 1, signals are represented as sequences of symbols that are each members of an alphabet A having n distinct symbols, where A is:

$$A=(a_1, a_2, a_3, \ldots a_n)$$

Note that the subscripts refer to the positions of the respective symbols within an ordered listing of the different symbols of the alphabet, and not to the positions of symbols in a signal. In FIG. 1, an initial, clean signal 102 comprises an ordered sequence of nine symbols from the alphabet A. The short input signal 102 is used for illustrative convenience though an input signal could have any number of signals.

The clean signal 102 is transmitted or passed through a noise-introducing channel 104, producing a noisy signal 106. In the example shown in FIG. 1, the output signal 106 comprises symbols from the same alphabet as the input signal 102, although, in general, the input symbols may be chosen from a different, equally sized or smaller alphabet than that from which the output symbols are selected. In the example shown in FIG. 1, the sixth symbol in the clean signal 108, "$a_9$," is altered by the noise-introducing channel to produce the symbol "$a_2$" 110 in the noisy signal 106. There are many different types of noise-introducing channels, each type characterized by the types and magnitudes of noise that the noise-introducing channel introduces into a clean signal. Examples of noise-introducing channels include electronic communications media, data storage devices to which information is transferred and from which information is extracted, and transmission and reception of radio and television signals. In this discussion, a signal is treated as a linear, ordered sequence of symbols, such as a stream of alphanumeric characters that comprise a text file, but the actual data into which noise is introduced by noise-introducing channels in real world situations may include two-dimensional images, audio signals, video signals, and other types of displayed and broadcast information.

In order to display, broadcast, or store a received, noisy signal with reasonable fidelity with respect to the initially transmitted clean signal, a denoising process may be undertaken to remove noise introduced into the clean signal by a noise-introducing channel. In FIG. 1, the noisy signal 106 is passed through, or processed by, a denoiser 112 to produce a recovered signal 114 which, when the denoising process is effective, is substantially closer to, or more perceptually similar to, the originally transmitted clean signal than to the received noisy signal.

The following discussion describes a discrete, universal denoiser, referred to as "DUDE," related to the present invention. The DUDE is discrete in the sense that the DUDE processes signals comprising discrete symbols using a discrete algorithm, rather than continuous mathematics. The DUDE is universal in that it asymptotically approaches the performance of an optimum denoiser employing knowledge of the clean-signal symbol-occurrence distributions without access to these distributions.

As shown in FIG. 1, the DUDE 112 employs a particular strategy for denoising a noisy signal. The DUDE considers each symbol within a context generally comprising one or more symbols preceding and following the symbol according to a left to right ordering. For example, in FIG. 1, the two occurrences of the symbol "$a_2$" in the noisy signal 106 occur within the same single preceding-and-following-symbol context. The full context for the two occurrences of the symbol "$a_2$" in the noisy signal 106 of the example in FIG. 1 is ["$a_3$," "$a_1$"]. The DUDE either leaves all symbols of a particular type "$a_i$" within a particular context unchanged, or changes all occurrences of a particular type of symbol "$a_i$" within a particular context to a different symbol "$a_j$." For example, in FIG. 1, the denoiser has replaced all occurrences of the symbol "$a_2$" 110 and 112 in the noisy signal within the full context ["$a_3$," "$a_1$"] with the symbol "$a_9$" 114 and 116 in the recovered symbol. Thus, the DUDE does not necessarily produce a recovered signal identical to the originally transmitted clean signal, but instead produces a denoised, recovered signal estimated to have less distortion with respect to the clean signal than the noisy signal. In the above example, replacement of the second symbol "$a_2$" 110 with the symbol "$a_9$" 114 restores the originally transmitted symbol at that position, but replacement of the first occurrence of symbol "$a_2$" 112 in the noisy signal with the symbol "$a_9$" 116 introduces a new distortion. The DUDE only replaces one symbol with another to produce the recovered signal when the DUDE estimates that the overall distortion of the recovered signal with respect to the clean signal will be less than the distortion of the noisy signal with respect to the clean signal.

FIGS. 2A-D illustrate a motivation for DUDE related to characteristics of the noise-introducing channel. DUDE assumes a memory-less channel. In other words, as shown in FIG. 2A, the noise-introducing channel 202 may be considered to act as a one-symbol window, or aperture, through which a clean signal 204 passes. The noise-introducing channel 202 corrupts a given clean-signal symbol, replacing the given symbol with another symbol in the noisy signal, with an estimateable probability that depends neither on the history of symbols preceding the symbol through the noise-introducing channel nor on the symbols that are subsequently transmitted through the noise-introducing channel.

FIG. 2B shows a portion of a table 206 that stores the probabilities that any particular symbol from the alphabet A, "$a_i$," may be corrupted to a symbol "$a_j$" during transmission through the noise-introducing channel. For example, in FIG. 2A, the symbol "$a_6$" 208 is currently passing through the noise-introducing channel. Row 210 in table 206 contains the probabilities that symbol "$a_6$" will be corrupted to each of the different, possible symbols in the alphabet A. For example, the probability that the symbol "$a_6$" will be changed to the symbol "$a_1$" 212 appears in the first cell of row 210 in table 206, indexed by the integers "6" and "1" corresponding to the positions of symbols "$a_6$" and "$a_1$" in the alphabet A. The probability that symbol "$a_6$" will be faithfully transferred, without corruption, through the noise-introducing channel 214 appears in the table cell with indices (6, 6), the probability of symbol "$a_6$" being transmitted as the symbol "$a_6$." Note that the sum of the probabilities in each row of the table 206 is 1.0, since a given symbol will be transmitted by the noise-introducing channel either faithfully or it will be corrupted to some other symbol in alphabet A. As shown in FIG. 2C, table 206 in FIG. 2B can be alternatively expressed as a two-dimensional matrix $\Pi$ 216, with the matrix element identified by indices (i, j) indicating the probability that symbol "$a_i$" will be transmitted by the noise-introducing channel as symbol "$a_j$." Note also that a column j in matrix $\Pi$ may be referred to as "$\pi_j$," or $\pi_{a_j}$.

As shown in FIG. 2D, a row vector 218 containing the counts of the number of each type of symbol in the clean signal, where, for example, the number of occurrences of the symbol "$a_5$" in the clean signal appears in the row vector as $m^{clean}[a_5]$, can be multiplied by the symbol-transition-probability matrix $\Pi$ 220 to produce a row vector containing the expected counts for each of the symbols in the noisy signal. The actual occurrence counts of symbols "$a_i$" in the noisy signal appear in the row vector $m^{noisy}$ shown as 222. The matrix multiplication is shown in expanded form 224 below the matrix multiplication in FIG. 2D. Thus, in vector notation:

$$m^{clean}\Pi \cong m^{noisy}$$

where
$m^{clean}$ is a row vector containing the occurrence counts of each symbol $a_i$ in alphabet A in the clean signal; and
$m^{noisy}$ is a row vector containing the occurrence counts of each symbol $a_i$ in alphabet A in the noisy signal.

The approximation symbol $\cong$ is employed in the above equation, because the probabilities in the matrix $\Pi$ give only the expected frequency of a particular symbol substitution, while the actual symbol substitution effected by the noise-introducing channel is random. Multiplying, from the right, both sides of the above equation by the inverse of matrix $\Pi$, assuming that $\Pi$ is invertible, allows for calculation of an estimated row-vector count of the symbols in the clean signal, $\hat{m}^{clean}$, from the counts of the symbols in the noisy signal, as follows:

$$\hat{m}^{clean} = m^{noisy}\Pi^{-1}$$

In the case where the noisy symbol alphabet is larger than the clean symbol alphabet, it is assumed that $\Pi$ is full-row-rank and the inverse in the above expression can be replaced by a generalized inverse, such as the Moore-Penrose generalized inverse.

As will be described below, the DUDE applies clean symbol count estimation on a per-context basis to obtain estimated counts of clean symbols occurring in particular noisy symbol contexts. The actual denoising of a noisy symbol is then determined from the noisy symbol's value, the resulting estimated context-dependent clean symbol counts, and a loss or distortion measure, in a manner described below.

As discussed above, the DUDE considers each symbol in a noisy signal within a context. The context may be, in a 1-dimensional signal, such as that used for the example of FIG. 1, the values of a number of symbols preceding, following, or both preceding and following a currently considered symbol. In 2-dimensional or higher dimensional signals, the context may be values of symbols in any of an almost limitless number of different types of neighborhoods surrounding a particular symbol. For example, in a 2-dimensional image, the context may be the eight pixel values surrounding a particular, interior pixel. In the following discussion, a 1-dimensional signal is used for examples, but higher dimensional signals can be effectively denoised by the DUDE.

Figure 3A:
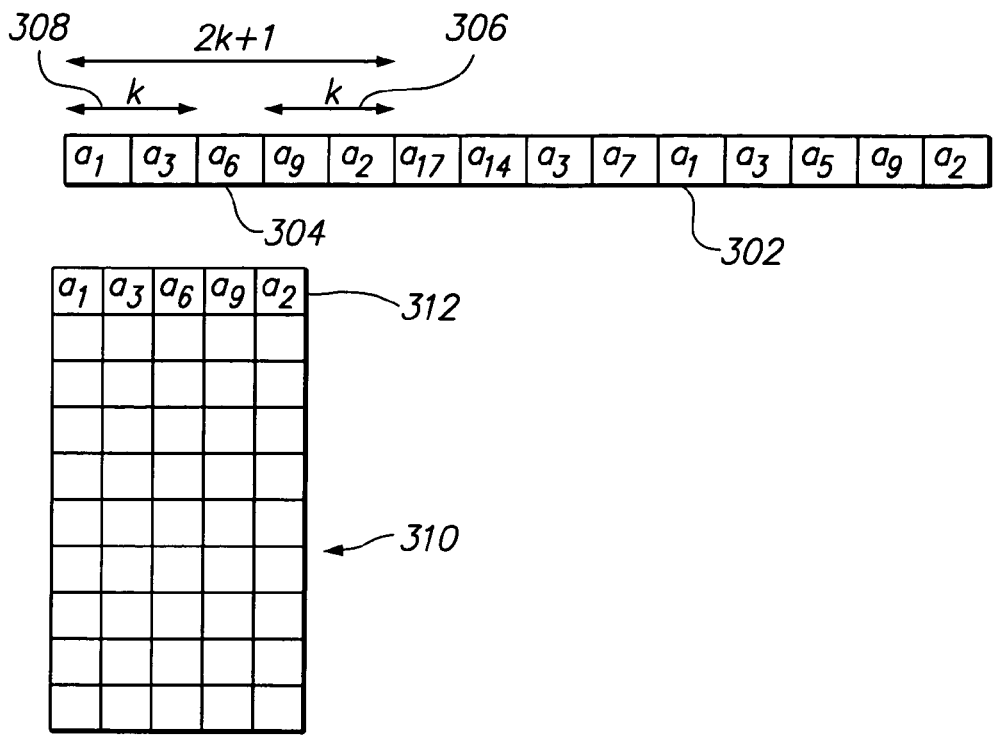
FIGS. 3A-D illustrate a context-based, sliding window approach by which a discrete, universal denoiser characterizes the occurrences of symbols in a noisy signal.

In order to consider occurrences of symbols within contexts in the 1-dimensional-signal case, the DUDE needs to consider a number of symbols adjacent to each considered symbol. FIGS. 3A-D illustrate a context-based, sliding window approach by which the DUDE characterizes the occurrences of symbols in a noisy signal. FIGS. 3A-D all employ the same illustration conventions, which are described only for FIG. 3A, in the interest of brevity. In FIG. 3A, a noisy signal 302 is analyzed by DUDE in order to determine the occurrence counts of particular symbols within particular contexts within the noisy signal. The DUDE employs a constant k to describe the length of a sequence of symbols preceding, and the length of a sequence of symbols subsequent to, a particular symbol that, together with the particular symbol, may be viewed as a metasymbol of length 2k+1. In the example of FIGS. 3A-D, k has the value "2." Thus, a symbol preceded by a pair of symbols and succeeded by a pair of symbols can be viewed as a five-symbol metasymbol. In FIG. 3A, the symbol "$a_6$" 304 occurs within a context of the succeeding k-length symbol string "$a_9 a_2$" 306 and is preceded by the two-symbol string "$a_1 a_3$" 308. The symbol "$a_6$" therefore occurs at least once in the noisy signal within the context ["$a_1 a_3$," "$a_9 a_2$"], or, in other words, the metasymbol "$a_1 a_3 a_6 a_9 a_2$" occurs at least once in the noisy signal. The occurrence of this metasymbol within the noisy signal 302 is listed within a table 310 as the first five-symbol metacharacter 312.

Figure 3B:
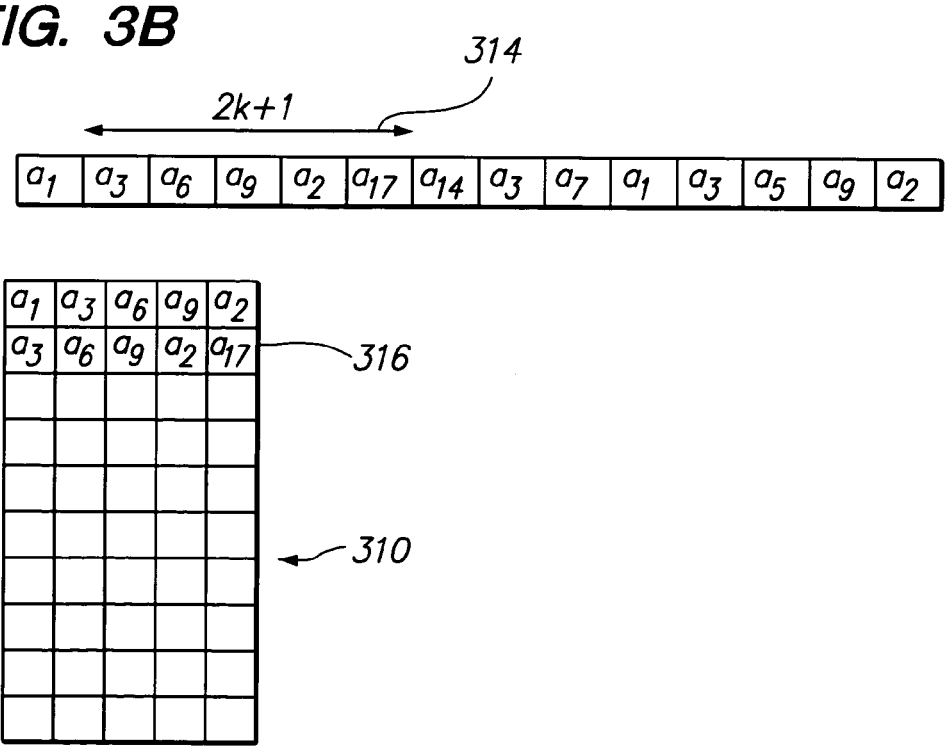
Figure 3C:
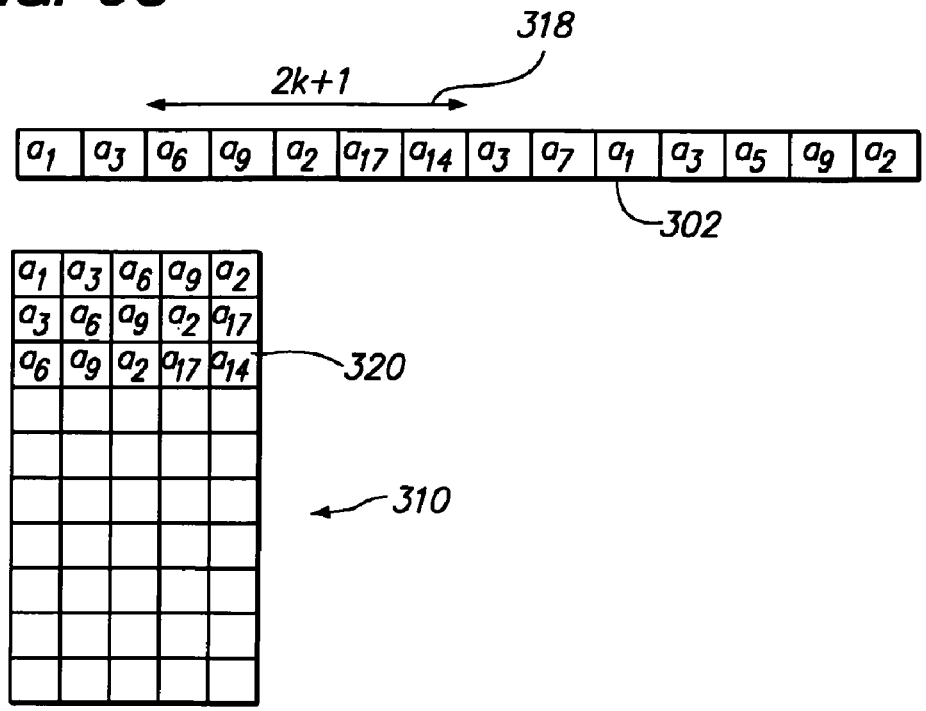
Figure 3D:
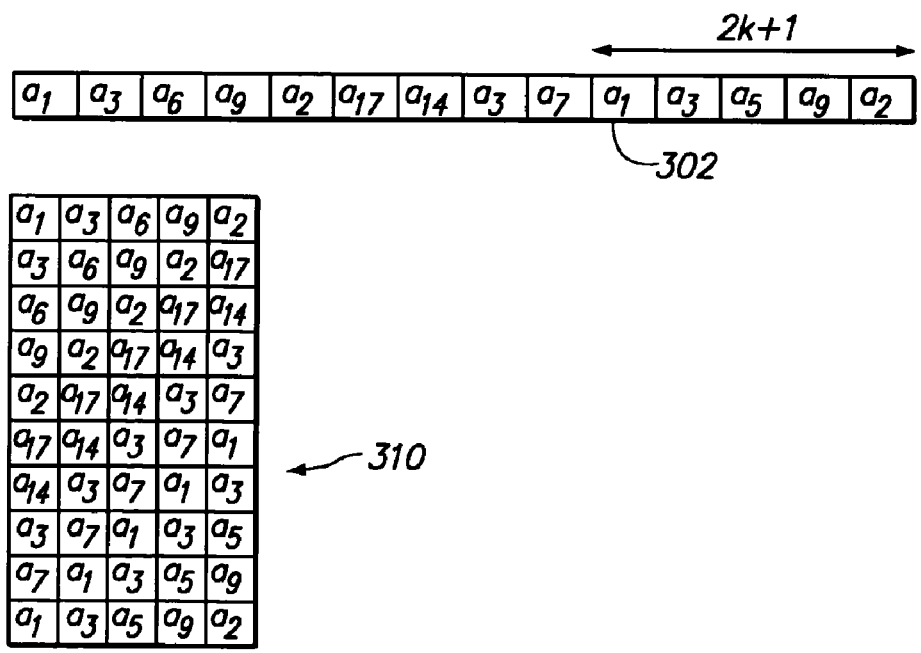

As shown in FIG. 3B, DUDE then slides the window of length 2k+1 rightward, by one symbol, to consider a second metasymbol 314 of length 2k+1. In this second metasymbol, the symbol "$a_9$" appears within the context ["$a_3 a_6$," "$a_2 a_{17}$"]. This second metasymbol is entered into table 310 as the second entry 316. FIG. 3C shows detection of a third metasymbol 318 in the noisy signal 302 and entry of the third metasymbol into table 310 as entry 320. FIG. 3D shows the table 310 following complete analysis of the short noisy signal 302 by DUDE. Although, in the examples shown in FIG. 3-D, DUDE lists each metasymbol as a separate entry in the table, in a more efficient implementation, DUDE enters each detected metasymbol only once in an index table, and increments an occurrence count each time the metasymbol is subsequently detected. In this fashion, in a first pass, DUDE tabulates the frequency of occurrence of metasymbols within the noisy signal or, viewed differently, DUDE tabulates the occurrence frequency of symbols within contexts comprising k preceding and k subsequent symbols surrounding each symbol.

Figure 4:
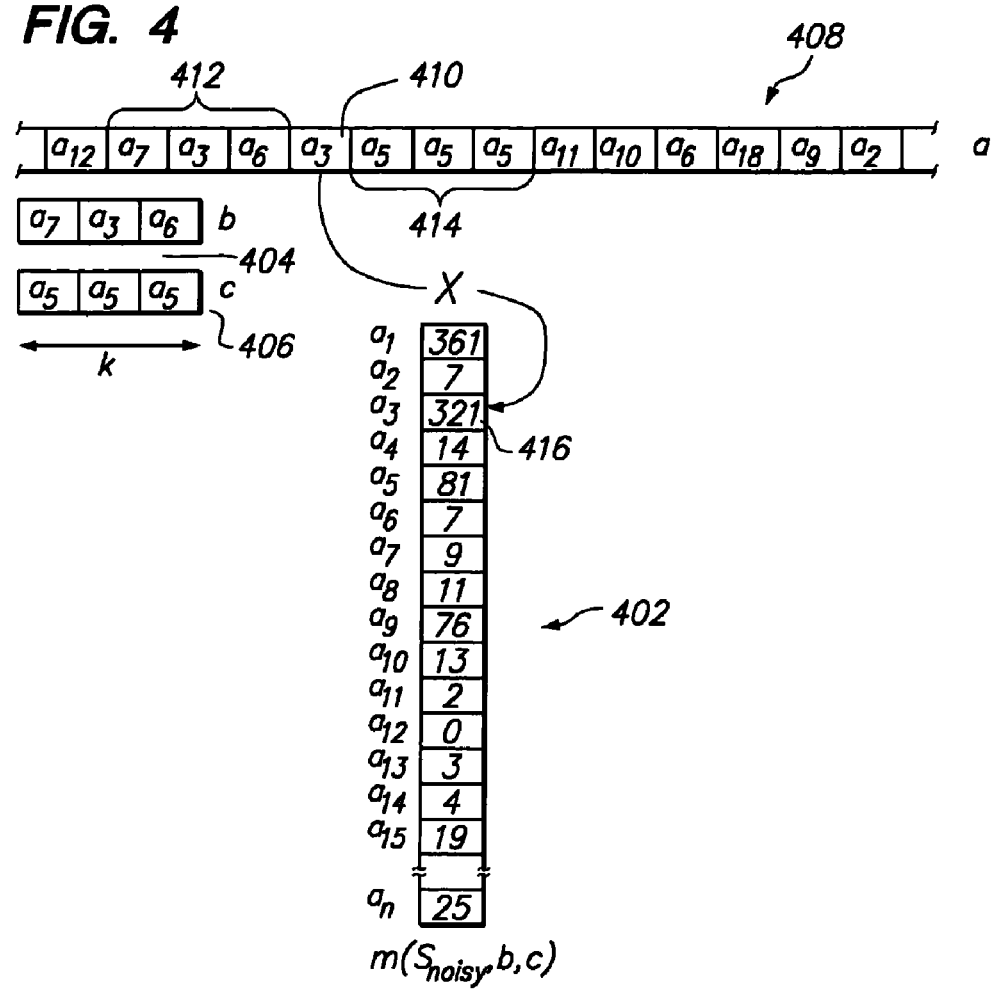
FIG. 4 illustrates a convenient mathematical notation and data structure representing a portion of the metasymbol table constructed by a discrete, universal denoiser, as described with reference to FIGS. 3A-D.

FIG. 4 illustrates a convenient mathematical notation and data structure representing a portion of the metasymbol table constructed by DUDE, as described with reference to FIGS. 3A-D. The column vector $m(s_{noisy}, b, c)$ 402 represents a count of the occurrences of each symbol in the alphabet A within a particular context, represented by the k-length symbol vectors b and c, within the noisy signal $s_{noisy}$, where the noisy signal is viewed as a vector. In FIG. 4, for example, the context value for which the occurrence counts are tabulated in column vector $m(s_{noisy}, b, c)$ comprises the symbol vector 404 and the symbol vector 406, where k has the value 3. In the noisy signal $s_{noisy}$ 408, the symbol "$a_3$" 410 occurs within the context comprising three symbols 412 to the left of the symbol "$a_3$" 410 and three symbols 414 to the right of the symbol "$a_3$". This particular context has a value equal to the combined values of symbol vectors 404 and 406, denoted ["$a_7 a_3 a_6$," "$a_5 a_5 a_5$"] and this occurrence of the symbol "$a_3$" 410 within the context ["$a_7 a_3 a_6$," "$a_5 a_5 a_5$"], along with all other occurrences of the symbol "$a_3$" in the context ["$a_7 a_3 a_6$," "$a_5 a_5 a_5$"], is noted by a count 416 within the column vector $m(s_{noisy}, b, c)$, with $[b, c] = ["a_7 a_3 a_6," "a_5 a_5 a_5"]$. In other words, a symbol "$a_3$" occurs within the context ["$a_7 a_3 a_6$," "$a_5 a_5 a_5$"] in the noisy signal $s_{noisy}$ 321 times. The counts for the occurrences of all other symbols "$a_1$", "$a_2$", and "$a_4$"-"$a_n$" in the context ["$a_7 a_3 a_6$," "$a_5 a_5 a_5$"] within noisy signal $s_{noisy}$ are recorded in successive elements of the column vector $m(s_{noisy}, "a_7 a_3 a_6", "a_5 a_5 a_5")$.

DUDE employs either a full or a partial set of column vectors for all detected contexts of a fixed length 2k in the noisy signal in order to denoise the noisy signal. Note that an initial set of symbols at the beginning and end of the noisy signal of length k are not counted in any column vector $m(s_{noisy}, b, c)$ because they lack either sufficient preceding or subsequent symbols to form a metasymbol of length 2k+1. However, as the length of the noisy signal for practical problems tends to be quite large, and the context length k tends to be relatively small, DUDE's failure to consider the first and final k symbols with respect to their occurrence within contexts makes almost no practical different in the outcome of the denoising operation.

Figure 5:
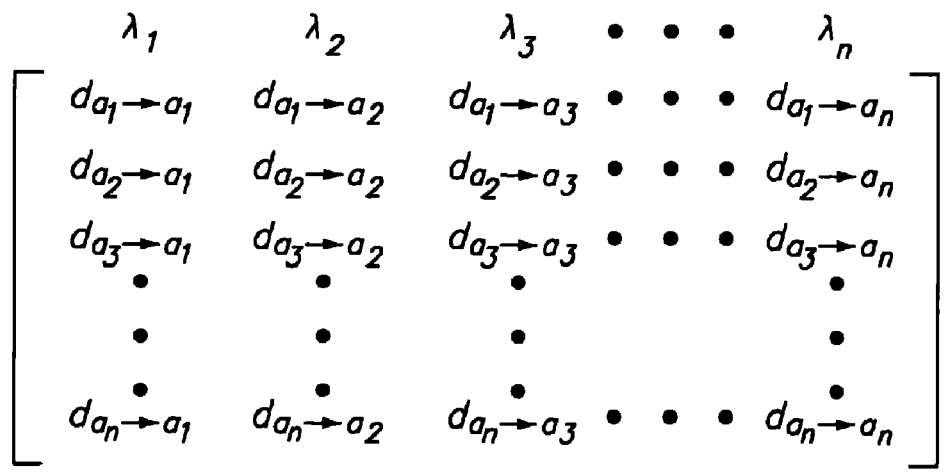
FIG. 5 displays one form of the symbol-transformation distortion matrix $\Lambda$.

The DUDE models the non-uniform distortion effects of particular symbol transitions induced by noise with a matrix Λ. FIG. 5 displays one form of the symbol-transformation distortion matrix Λ. An element $d_{a_i \to a_j}$ of the matrix Λ provides the relative distortion incurred by substituting the symbol "$a_j$" in the noisy or recovered signal for the symbol "$a_i$" in the clean signal. An individual column j of the matrix Λ may be referred to as $\lambda_j$ or $\lambda_{a_j}$.

FIG. 6 illustrates computation of the relative distortion, with respect to the clean signal, expected from replacing a symbol "$a_a$" in a received, noisy signal by the symbol "$a_x$." As shown in FIG. 6, element-by-element multiplication of the elements of the column vectors $\lambda_{a_x}$ and $\pi_{a_a}$, an operation known as the Schur product of two vectors, and designated in the current discussion by the symbol $\odot$, produces the column vector $\lambda_{a_x} \odot \pi_{a_a}$ in which the i-th element is the product of a distortion and probability, $d_{a_i \to a_x} p_{a_i \to a_a}$, reflective of the relative distortion expected in the recovered signal by replacing the symbol $a_a$ in the noisy symbol by the symbol "$a_x$" when the symbol in the originally transmitted, clean signal is "$a_i$."

FIG. 7 illustrates use of the column vector $\lambda_{a_x} \odot \pi_{a_a}$ to compute a distortion expected for replacing "$a_a$" in the metasymbol $ba_ac$ in a noisy signal $s_{noisy}$ by the replacement symbol "$a_x$". In the following expression, and in subsequent expressions, the vectors $s_{noisy}$ and $s_{clean}$ denote noisy and clean signals, respectively. A different column vector q can be defined to represent the occurrence counts for all symbols in the clean signal that appear at locations in the clean signal that correspond to locations in the noisy signal around which a particular context [b,c] occurs. An element of the column vector q is defined as:

$$q(s_{noisy}, s_{clean}, b, c)[a_a] = |\{i : s_{clean}[i] = a_a, (s_{noisy}[i-k], s_{noisy}[i-k+1], \ldots, s_{noisy}[i-1]) = b, (s_{noisy}[i+1], s_{noisy}[i+2], \ldots, s_{noisy}[i+k]) = c\}|,$$

where $s_{clean}[i]$ and $s_{noisy}[i]$ denote the symbols at location i in the clean and noisy signals, respectively; and $a_a$ is a symbol in the alphabet A.

The column vector $q(s_{noisy}, s_{clean}, b, c)$ includes n elements with indices $a_a$ from "$a_1$" to "$a_n$" where n is the size of the symbol alphabet A. Note that the column vector $q(s_{noisy}, s_{clean}, b, c)$ is, in general, not obtainable, because the clean signal, upon which the definition depends, is unavailable. Multiplication of the transpose of the column vector $q(s_{noisy}, s_{clean}, b, c)$, $q^T(s_{noisy}, s_{clean}, b, c)$, by the column vector $\lambda_{a_x} \odot \pi_{aa}$ produces the sum of the expected distortions in the column vector times the occurrence counts in the row vector that together provide a total expected distortion for replacing "$a_a$" in the metasymbol $ba_ac$ in $s_{noisy}$ by "$a_x$". For example, the first term in the sum is produced by multiplication of the first elements in the row vector by the first element in the column vector, resulting in the first term in the sum being equal to $q^T(s_{noisy}, s_{clean}, b, c)[a_1](p_{a_1 \to a_a} d_{a_1 \to ax})$ or, in other words, a contribution to the total distortion expected for replacing "$a_a$" by "$a_x$" in all occurrences of $ba_ac$ in $s_{noisy}$ when the corresponding symbol in $s_{clean}$ is $a_1$. The full sum gives the full expected distortion:

$$q^T(s_{noisy}, s_{clean}, b, c)[a_1](p_{a_1 \to a_a} d_{a_1 \to a_x}) +$$

$$q^T(s_{noisy}, s_{clean}, b, c)[a_2](p_{a_2 \to a_a} d_{a_2 \to a_x}) +$$

$$q^T(s_{noisy}, s_{clean}, b, c)[a_3](p_{a_3 \to a_a} d_{a_3 \to a_x}) +$$

.

.

.

$$q^T(s_{noisy}, s_{clean}, b, c)[a_n](p_{a_n \to a_a} d_{a_n \to a_x})$$

As discussed above, DUDE does not have the advantage of knowing the particular clean signal, transmitted through the noise-introducing channel that produced the received noisy signal. Therefore, DUDE estimates the occurrence counts, $q^T(s_{noisy}, s_{clean}, b, c)$, of symbols in the originally transmitted, clean signal, by multiplying the row vector $m^T(s_{noisy}, b, c)$ by $\Pi^{-1}$ from the right. FIG. 8 shows estimation of the counts of the occurrences of symbols "$a_1$"-"$a_n$" for the clean signal.

The resulting expression $$m^T(s_{noisy}, b, c) \Pi^{-1}(\lambda_{a_x} \odot \pi_{a_a})$$

obtained by substituting $m^T(s_{noisy}, b, c) \Pi^{-1}$ for $q^T(s_{noisy}, s_{clean}, b, c)$ represents DUDE's estimation of the distortion, with respect to the originally transmitted clean signal, produced by substituting "$a_x$" for the symbol "$a_a$" within the context [b,c] in the noisy signal $s_{noisy}$. DUDE denoises the noisy signal by replacing "$a_a$" in each occurrence of the metasymbol $ba_ac$ by that symbol "$a_x$" providing the least estimated distortion of the recovered signal with respect to the originally transmitted, clean signal, using the above expression. In other words, for each metasymbol $ba_ac$, DUDE employs the following transfer function to determine how to replace the "central" symbol $a_a$:

$$g^k(b, a_\alpha, c) = \frac{\arg\min}{a_x = a_1 \text{ to } a_n}[m^T(s_{noisy}, b, c) \Pi^{-1}(\lambda_{a_x} \odot \pi_{a_\alpha})]$$

In some cases, the minimum distortion is produced by no substitution or, in other words, by the substitution $a_x$ equal to $a_a$.

Figure 9:
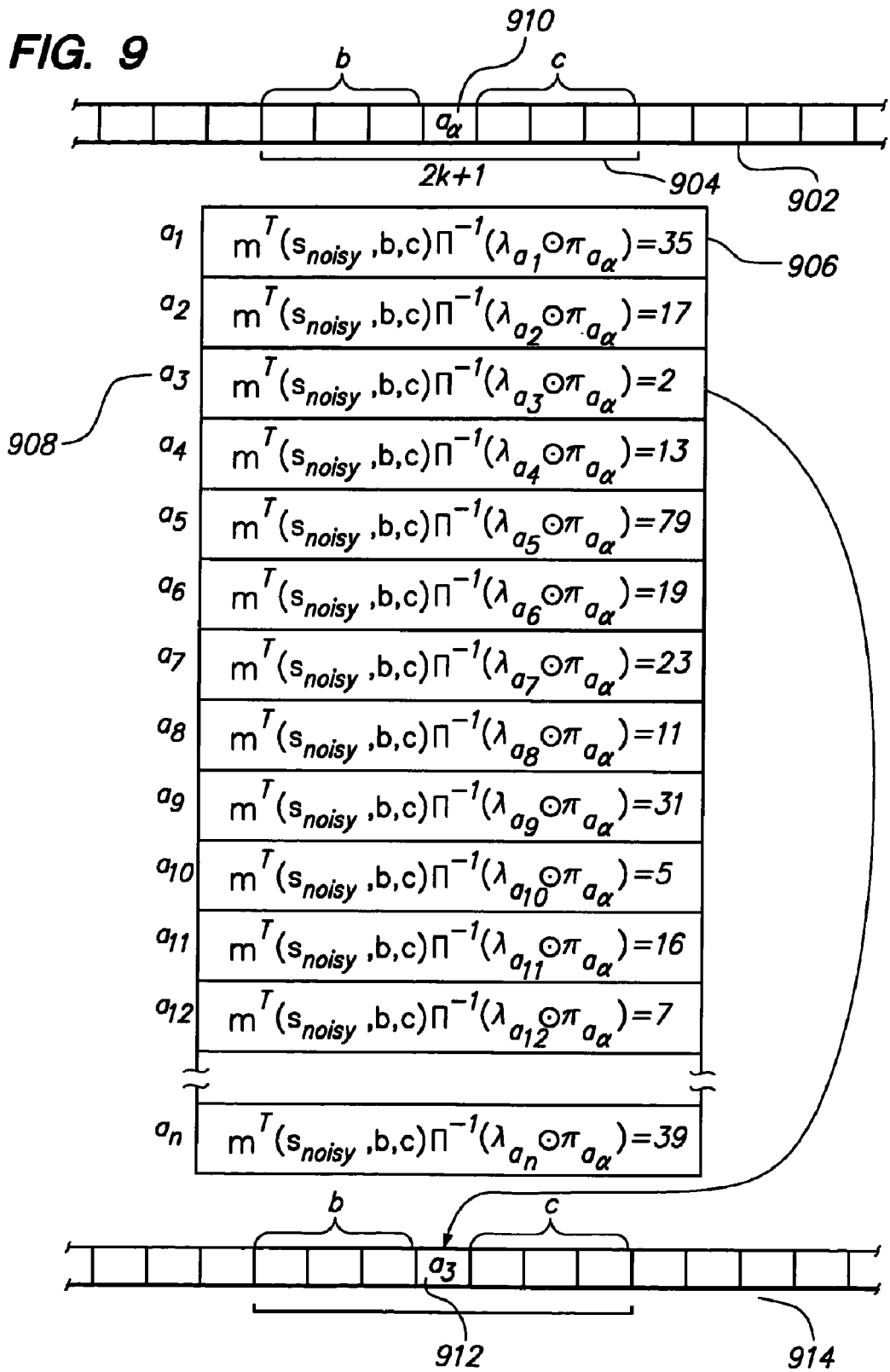
FIG. 9 illustrates the process by which a discrete, universal denoiser denoises a noisy, received signal.

FIG. 9 illustrates the process by which DUDE denoises a noisy, received signal. First, as discussed above, DUDE compiles counts for all or a portion of the possible metasymbols comprising each possible symbol "$a_i$" within each possible context [b,c]. As discussed above, the counts are stored in column vectors $m(s_{noisy}, b, c)$. In the next pass, DUDE again passes a sliding window over the noisy signal 902. For each metasymbol, such as metasymbol 904, DUDE determines the relative distortions of the recovered signal with respect to the clean signal that would be produced by substituting for the central character of the metasymbol "$a_a$" each possible replacement symbol "$a_i$" in the range i=1 to n. These relative distortions are shown in table 906 in FIG. 9 for the metasymbol 904 detected in the noisy signal 902. Examining the relative distortion table 906, DUDE selects the replacement symbol with the lowest relative distortion, or, in the case that two or more symbols produce the same relative distortions, selects the first of the multiple replacement symbols with the lowest estimated distortion. In the example shown in FIG. 9, that symbol is "$a_3$" 908. DUDE then replaces the central symbol "$a_a$" 910 in the noisy signal with the selected replacement symbol "$a_3$" 912 in the recovered signal 914. Note that the recovered signal is generated from independent considerations of each type of metasymbol in the noisy signal, so that the replacement symbol selected in a previous step does not affect the choice for a replacement symbol in a next step for a different metasymbol. In other words, the replacement signal is generated in parallel, rather than substitution of symbols directly into the noisy signal. As with any general method, the above-described method by which DUDE denoises a noisy signal can be implemented using various data structures, indexing techniques, and algorithms to produce a denoising method that has both linear time and linear working-data-set complexities or, in other words, the time complexity is related to the length of the received, noisy signal, by multiplication by a constant, as is the working-data-set complexity.

The examples employed in the above discussion of DUDE are primarily 1-dimensional signals. However, as also discussed above, 2-dimensional and multi-dimensional signals may also be denoised by DUDE. In the 2-and-multi-dimensional cases, rather than considering symbols within a 1-dimensional context, symbols may be considered within a contextual neighborhood. In 1-dimensional cases, a different number of preceding and following symbols may be used for the neighborhood, or symbols either only preceding or following a current considered symbol may be used. The pixels adjacent to a currently considered pixel in a 2-dimensional image may together comprise the contextual neighborhood for the currently considered symbol, or, equivalently, the values of a currently considered pixel and adjacent pixels may together comprise a 2-dimensional metasymbol.

In a more general treatment, the expression $m^T(s_{noisy},b,c) \Pi^{-1}(\lambda_{a_x} \odot \pi_{a_a})$ may be replaced by the more general expression:

$$m^T(s_{noisy},\eta)\Pi^{-1}(\lambda_{a_x} \odot \pi_{a_a})$$

where $\eta$ denotes the values of a particular contextual neighborhood of symbols. The neighborhood may be arbitrarily defined according to various criteria, including proximity in time, proximity in display or representation, or according to any arbitrary, computable metric, and may have various different types of symmetry.

Dude+

As described above with respect to the DUDE method, in a first pass of a sliding window over the noisy signal, counts are compiled for all or a portion of the possible metasymbols where the metasymbols include each symbol "$a_i$" of the alphabet (where i=1 to n) within each context [b,c]. These counts are used to generate the column vectors $m(s_{noisy},b,c)$ shown in FIG. 4. In a second pass of the sliding window, for each metasymbol encountered in the noisy signal, DUDE computes estimates of the distortions with respect to the clean signal that would be produced by exchanging the central symbol "$a_a$" of the metasymbol with each possible replacement symbol "$a_i$" in the range i=1 to n. DUDE then selects the symbols to minimize the estimated distortion. Thus, the output of the DUDE method is a sequence of symbols, as shown in FIG. 1.

In an embodiment, referred to herein as "DUDE+", the DUDE method is modified to generate reliability information regarding the symbols in the noisy signal. The reliability information quantitatively represents the belief of the algorithm in the likelihood of the values of the unknown clean signal. FIG. 10 illustrates a system 1000 in accordance with an embodiment of the present invention for generating a recovered, less-noisy signal 1002 and for generating reliability information 1004. In an embodiment, the system 1000 implements the DUDE+ method and generates one or both of the recovered signal 1002 and/or the reliability information 1004. In an embodiment, the reliability information is provided in machine-readable form which may be used for further processing.

Instead of, or in addition to, selecting substitute symbols for inclusion in the recovered signal as in DUDE, DUDE+ does the following: for each metasymbol encountered in the second pass, DUDE+ computes an estimate of the probability that the value in the clean signal that corresponds to the position of the central symbol "$a_a$" of the metasymbol of the noisy signal assumed a particular symbol value, with an estimated probability being computed for each possible symbol "$a_i$" in the alphabet.

For example, for a particular metasymbol [b, $a_3$, c] encountered in the noisy output signal, DUDE+ generates as an output reliability information in the form of: an estimate of the probability that the value in the clean signal that corresponds to the received central symbol $a_3$ was in fact the symbol $a_1$ (e.g., 0.28%); an estimate of the probability that the value in the clean signal corresponding to the central symbol $a_3$ was in fact the symbol $a_2$ (e.g., 1.9%); an estimate of the probability that the value in the clean signal corresponding to the central symbol in the received signal was in fact the symbol $a_3$ (e.g., 80%); and so forth for each symbol in the alphabet. Thus, for each metasymbol occurring in the noisy signal, an estimated probability is determined for each possible value of the clean symbol corresponding to the central symbol of the metasymbol. This estimated probability represents the probability that the value in the clean signal corresponding to the central symbol of the metasymbol assumed each of the possible values. A set (a vector) of n estimated probabilities is generated for each metasymbol encountered in the noisy signal. The sum of the estimated probababilities for each metasymbol is one (i.e. 100%). Because the set of probabilities depends on the particular metasymbol (including its central symbol), the same set of probabilities is generated for each unique metasymbol.

To compute these estimates of the probabilities, an estimated conditional distribution may first be computed in accordance with the following expression:

$$(m^T(s_{noisy},b,c,)\Pi^{-1})[a_x]\Pi(a_x,a_a) \text{ with } x=1, 2, \ldots, n$$

where $(v)[x]$ denotes the x-th component of a vector v. $\Pi(a_x, a_a)$ is also denoted herein as $p_{a_x \to a_a}$ which is the probability that symbol $a_x$ will be transmitted by the noise-introducing channel as $a_a$. The estimated conditional distribution for a particular metasymbol includes an estimate of the number of times a particular metasymbol occurs in the clean signal where the noisy channel has caused the central symbol to be unchanged and also includes a set of values which represent an estimate of the number of times the central symbol has been changed from a particular other one of the symbols of the alphabet.

The above expression is applicable to one-dimensional signals in which the context [b,c] represents symbols appearing before or after a particular symbol. More generally, reliability information may be computed for other context types, such as two-dimensional image data. An estimated conditional distribution for the more general case may thus be computed in accordance with the following expression:

$$(m^T(s_{noisy},\eta)\Pi^{-1})[a_x]\Pi(a_x,a_a) \text{ with } x=1, 2, \ldots, n$$

where $\eta$ denotes the values of a particular contextual neighborhood of symbols.

FIG. 11 illustrates an estimated conditional distribution and probabilities for an exemplary metasymbol in a noisy received signal in accordance with an embodiment of the present invention. As shown in FIG. 11, the conditional distribution is computed for an exemplary metasymbol [b, $a_3$, c] which includes the symbol $a_3$ in a context [b,c]. The conditional distribution includes a value corresponding to each symbol in the alphabet of n symbols. Accordingly, the distribution includes n terms. The conditional distribution may be converted to conditional probabilities by dividing each term by the total of the terms, where the total is the sum over x. As shown in FIG. 11, the conditional probabilities are represented as percentages, but may also be represented as fractions. Both the conditional distribution and the conditional probabilities are referred to herein as reliability information.

FIG. 11 shows reliability information as a list or distribution including n values for a particular metasymbol encountered in the noisy signal. It will be apparent that the reliability information for the collection of metasymbols that occur in the noisy signal may be presented in multiple different ways. In a first example, the reliability information may be output from the DUDE+ method as a sequence of lists, each list being correlated to a particular symbol in the noisy signal. In this case, there is a one-to-one correspondence between lists being output and symbols occurring in the noisy signal. Thus, when a metasymbol is repeated in the noisy signal, the corresponding list is also repeated. Accordingly, where the signal is N symbols long, N reliability information lists are output by the DUDE+ method. In a second example, the reliability information may be output from the DUDE+ method as a collection of such lists, including one list for each metasymbol occurring in the noisy signal. In this case, the reliability information lists are not correlated in time or sequence to the particular symbols that occur in the noisy signal. Thus, the reliability information for a particular metasymbol is not repeated even though the particular metasymbol occurs many times in the noisy signal. Accordingly, where there are M unique metasymbols in the noisy signal, M reliability information lists are output by the DUDE+ method.

Dude++

In certain circumstances, the components of an underlying noise-free clean signal are finite valued, yet their noisy observations take values in a continuous alphabet, such as the real numbers or vectors of real numbers. As before, the alphabet A of the noise-free signal can be expressed as:

$$A=(a_1, a_2, a_3, \ldots a_n)$$

where the size of the alphabet n is finite. However, the alphabet $\mathbb{R}$ of the noisy signal output from the channel is not so limited. Thus, the output signal can include members of a general, possibly continuous alphabet.

The DUDE and DUDE+ denoising approaches described above are based on accumulating counts of occurrences of contextual neighborhoods of symbols appearing in the noisy observation signal in a first pass. A metasymbol represents a particular symbol within a context of other symbols. For simplicity of explanation, the description of the DUDE++ approach herein is directed primarily to one-dimensional signals where the context of a given symbol is composed of k symbols occurring to the right and to the left of the symbol and, thus, the neighborhood or metasymbol is a string of length 2k+1. It will be apparent that the techniques described herein can be applied to multi-dimensional signals, such as images, and that contexts can be composed of arbitrary neighborhoods or groupings of symbols.

In a second pass of the DUDE approach, for each particular symbol encountered within a particular context, the symbol is replaced based on whether the replacement is estimated to result in the least overall distortion relative to the input signal. In a second pass of the DUDE+ approach, for each metasymbol encountered, an estimate of the probability that the value in the input signal that corresponds to the position of the central symbol "$a_a$" of the metasymbol of the noisy signal assumed a particular symbol value is computed, with an estimated probability being computed for each possible symbol "$a_i$" in the input (clean) alphabet. The estimated probabilities are 'soft' information which may be expressed as a conditional distribution or as conditional probabilities, which are collectively referred to herein as reliability information.

Where the output signal includes members of the general, possibly continuous alphabet, each metasymbol appearing in the output signal can be distinct. Thus, an approach uses a processed version of the observed noisy signal to estimate the distribution of 2k+1 metasymbols in the input signal in a first pass. The distribution of the input signal is estimated based on quantizing the observed noisy signal. This can be done with any quantizer having the property that the induced channel matrix Π is invertible. Here, the channel matrix Π can be expressed as a two-dimensional matrix with the matrix element identified by indices (i, j) indicating the probability that symbol "$a_i$" in the input signal will be observed as symbol "$a_j$" in the quantized observation signal received from the noise-introducing channel. This assumes, for simplicity, that the quantizer output takes values in the finite input signal alphabet.

Thus, when employed on the quantized signal, the first pass is similar to that of the DUDE and DUDE+ approaches described herein in that counts of occurrences of strings (i.e. metasymbols) of length 2k+1 appearing in the noisy quantized signal are accumulated. In a second pass, the input symbol at each location may be estimated based on the 2k+1 noisy components around it, assuming the estimated input distribution similar to the DUDE approach described herein. Further, in the second pass, estimates of the conditional probability that the value in the input signal that corresponds to the position of the central symbol of the metasymbol of the noisy signal assumed a particular symbol value may be computed, similarly to the DUDE+ approach. These estimates of probabilities are referred to herein as reliability information. In a preferred embodiment, measures are taken to restore channel probability density information lost through quantization of the noisy observation signal.

Figure 12:
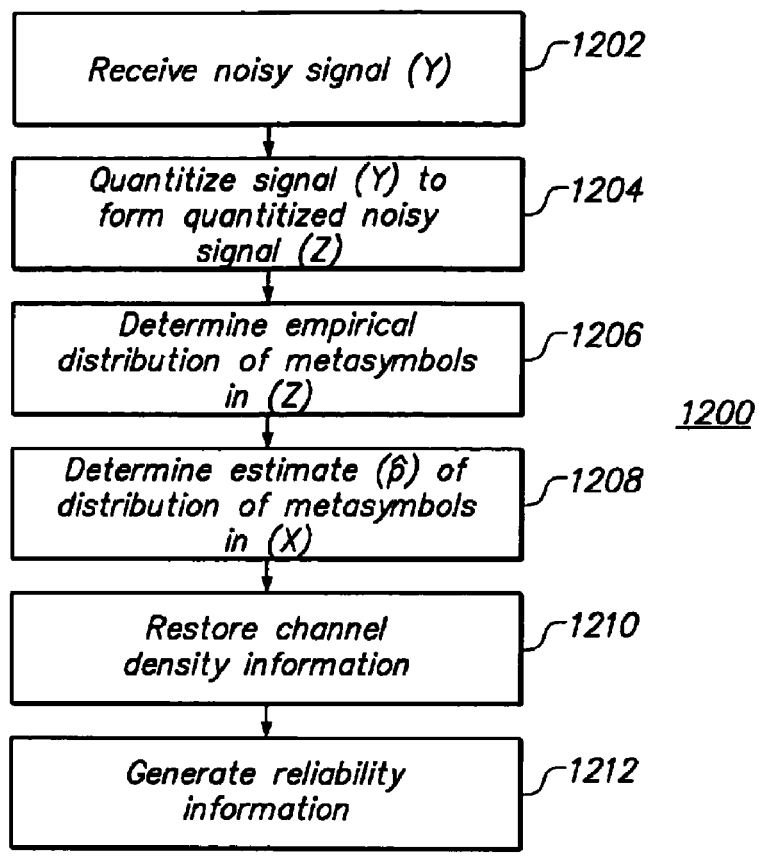
FIG. 12 illustrates a quantizer for converting a general noisy signal to a finite noisy signal in accordance with an embodiment of the present invention.
Figure 13:
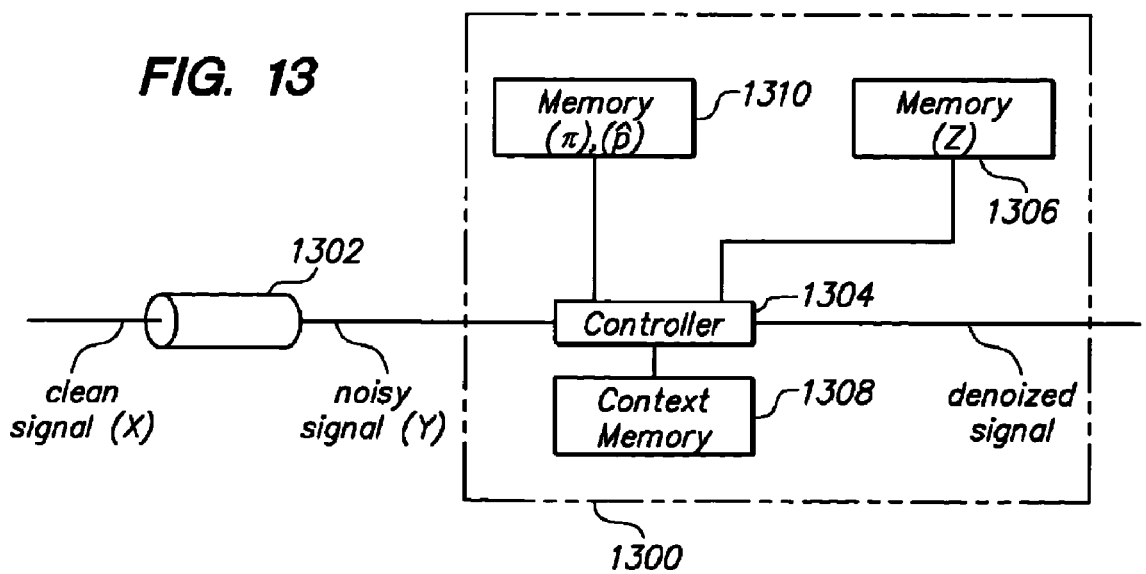
FIG. 13 illustrates a system in accordance with an embodiment of the present invention for generating a recovered, less-noisy signal from a finite input, general output channel and for generating reliability information in accordance with an embodiment of the present invention.

FIG. 12 illustrates a method 1200 of denoising a signal received from a finite input, general output channel in accordance with an embodiment of the present invention. FIG. 13 illustrates a system 1300 in accordance with an embodiment of the present invention for generating a recovered, less-noisy signal from a finite input, general output channel and for generating reliability information in accordance with an embodiment of the present invention. The system 1300 may be used to implement the method 1200.

A clean signal $X=(X_1, X_2, X_3, \ldots)$ is applied to a noise-introducing channel 15302 (FIG. 13) to produce a noisy signal Y where the noisy signal Y includes a received sequence of symbols $Y=(Y_1, Y_2, Y_3, \ldots)$. In step 1202 (FIG. 12), the noisy signal Y is received.

Figure 14:
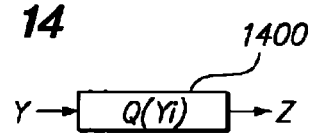
FIG. 14 illustrates a method of denoising a signal received from a finite input, general output channel in accordance with an embodiment of the present invention.

In step 1204, quantization is performed on the received sequence to form a quantized version of the received sequence given by $Z=(Z_1, Z_2, Z_3, \ldots)$. The function performed by the quantizer may be given as $Z_i=Q(Y_i)$. FIG. 14 illustrates a quantizer 1400 for converting a general noisy signal Y to a finite alphabet noisy signal Z in accordance with an embodiment of the present invention.

The quantizer 1400 essentially maps the set of received symbols Y to a finite set of symbols, with some loss of information. The quantizer may be implemented by the controller 1304 of FIG. 13. The controller 1304 may then store the quantized sequence of symbols Z in a memory 1306.

The matrix Π (i, j) denotes the symbol-transition probability matrix for the channel, with a matrix element identified by indices (i, j) indicating the probability that symbol "$a_i$" will be transmitted as symbol "$a_j$" in the quantized observation signal received from the noise-introducing channel. The matrix Π is induced by quantizing the noisy sequence of symbols with the quantizer:

$$\Pi(,j) = \int_{y: Q(y)=j} f_i(y) dy,$$

where $f_i(y)$ denotes the conditional probability density of the real valued channel output when the channel input is "$a_i$".

The quantizer should be selected so that the above equation results in the matrix $\Pi$ being invertible. It is assumed that the quantizer has this property. For example, where the input sequence X is binary, such that each symbol in the input sequence X is either one or minus one, and the channel is an additive white Gaussian noise channel (or other additive noise channel with a symmetrical about zero noise distribution), a suitable quantizer may be given as:

$$Q(Y_i) = \begin{cases} 1 & \text{for } Y_i \geq 0 \\ -1 & \text{otherwise} \end{cases}$$

The resulting matrix $\Pi$ will be symmetric and invertible.

In step 1206, an empirical distribution of metasymbols of length $2k+1$ is determined from the quantized sequence of symbols (Z). The empirical distribution is arranged to form a column vector $\vec{r}$ in such a way that the i-th component of $\vec{r}$ is the empirical frequency of the i-th string in a lexicographic ordering of the strings of length $2k+1$ over the quantizer output alphabet, which is assumed to be in the order $a_1$, $a_2, \ldots, a_n$. The entry of $\vec{r}$ corresponding to a string $z_1$, $z_2, \ldots, z_{2k+1}$ may also be given as:

$$\vec{r}[z_1, z_2, \ldots, z_{2k+1}]$$

The empirical distribution may be stored in a memory 1308 (FIG. 13).

In step 1208, an estimate of the distribution of metasymbols in the input signal is determined. This may be computed using the expression:

$$\hat{p} = [(\Pi_{2k+1})^{-1}]^T \cdot \vec{r},$$

where $\Pi_{2k+1}$ denotes the $2k+1$-th fold tensor product of $\Pi$ with itself and represents a $2k+1$ block or metasymbol channel probability matrix. The multiplication by the inverse may be implemented using well known fast techniques for multiplication by matrices formed as tensor products of smaller matrices. Note that in this case the inverse of $\Pi_{2k+1}$ is itself a $2k+1$-th fold tensor product of $\Pi^{-1}$.

Thus, in step 1208, the empirical distribution vector determined from the quantized observed output symbols $\vec{r}$ is multiplied by the inverse of the $2k+1$ metasymbol channel probability matrix $\Pi_{2k+1}$ to obtain an estimate $\hat{p}$ of the distribution of metasymbols of length $2k+1$ in the clean input signal X. The correspondence between entries of $\hat{p}$ and strings over the alphabet $a_1, a_2, \ldots, a_n$ is the same as above for the vector $\vec{r}$. The matrix $\Pi$ and/or its inverse transform may be stored in memory 1310 (FIG. 13). The estimate $\hat{p}$ of distributions of metasymbols may also be stored in the memory 1310.

A second pass is then performed. In step 1210, channel probability density information lost through the quantization step 1204 is preferably restored. This may be accomplished by multiplying the estimate $\hat{p}$ by the channel probability density evaluated at the channel output values that were actually observed:

$$\hat{p}(x_{i-k}^{i+k}, z_{i-k}^{i+k}) = \hat{p}[x_{i-k}^{i+k}] \cdot \prod_{j=i-k}^{i-k} f_{x_j}(z_j)$$

The result represents an estimate of the joint probability distribution of $2k+1$ tuples of original and noisy symbols.

In step 1212, reliability information is generated. This is may be accomplished by summing the joint probability distribution over all the values that the context symbols can possibly take on to determine their contributions:

$$\hat{p}(x_i \mid z_{i-k}^{i+k}) \propto \sum_{x_{i-k}^{i-1}, x_{i+1}^{i+k}} \hat{p}(x_{i-k}^{i+k}, z_{i-k}^{i+k})$$

This has the effect of marginalizing the context symbols in each metasymbol, resulting, after normalization (so that $$\sum_{x_i} \hat{p}(x_i \mid z_{i-k}^{i+k})$$

is 1), in a conditional probability distribution on the i-th input symbol given its corresponding noisy metasymbol. This computation is repeated for each index i to generate a sequence of conditional probability (reliability) estimates. The resulting reliability information is the output of step 1212 in FIG. 12. The resulting reliability estimates may then be stored in memory 1306. As in the DUDE+ approach, the reliability information may be presented in multiple different ways. For example, the reliability information may be presented as plurality of lists, which may or may not be correlated in time or sequence to the particular symbols that occur in the quantized noisy signal (Z).

Step 1210 may be omitted. In this case, information lost due to the quantization step 1204 is not taken into account. However, in the preferred method, the step 1210 is performed to take into account information loss due to quantization.

If desired, the reliability estimates obtained from the noisy signal may then be used to generate a recovered signal. In this case, for each metasymbol, the relative distortions are determined of the recovered signal with respect to the input signal that would be produced by substituting for the central symbol of the metasymbol each possible replacement symbol "$a_i$" in the range i=1 to n. This step may make use of the symbol-transformation distortion matrix $\Lambda$. The replacement symbol with the lowest estimated relative distortion is selected and inserted into the recovered signal. The recovered signal is generated from independent considerations of each type of metasymbol in the noisy signal If step 1210 is omitted, then the reliability information may be generated in accordance with the DUDE+ method described above, using the quantized noisy signal generated in step 1204. In this case, for each metasymbol encountered in the second pass, an estimate of the probability that the value in the clean signal that corresponds to the position of the central symbol "$a_a$" of the metasymbol of the noisy signal assumed a particular symbol value, with an estimated probability being computed for each possible symbol "$a_i$" in the alphabet.

To compute these estimates of the probabilities, an estimated conditional distribution may be computed in accordance with the following expression:

$$(m^T(Z, \eta)\Pi^{-1})[a_x]\Pi(a_x, a_a) \text{ with } x=1, 2, \ldots, n$$

where η denotes the values of a particular contextual neighborhood of symbols in the quantized noisy signal Z (in the one-dimensional signals discussed above, η corresponds to the values of the k long left and right contexts). The vector m is defined as in the DUDE and DUDE+ descriptions and thus represents counts of occurrences of symbols within a particular context determined from the quantized signal. As before, the conditional distribution may be converted to conditional probabilities by dividing each term by the total of the terms, where the total is the sum over x.

The above approach for denoising for a finite input, general output channel is described in Dembo and Weissman, "Universal denoising for the finite-input general-output channel," IEEE Transactions on Information Theory, pp. 1507-1516, Vol. 51, No. 4, April 2005, the entire contents of which are hereby incorporated by reference.

Error Correction Decoding with DUDE++

As described above, the DUDE+method generates reliability information instead of, or in addition to, the less noisy sequence of symbols. Certain conventional error correction coding schemes may accept the reliability information for performing error correction. In addition, certain conventional error correction coding schemes may provide enhanced reliability information as an output. Decoders that implement such methods that accept reliability information as input and that generate reliability information are known as soft-input, soft-output (SISO) decoders. The belief propagation algorithm for decoding low density parity check (LDPC) codes and the iterative turbo decoding algorithm for decoding turbo codes are examples of SISO decoding algorithms.

In an embodiment of the invention, redundancy is added to signal data prior to transmission via a noise-introducing channel. This may be accomplished by using a error correction code (ECC) encoder in a preliminary signal processing system stage. Upon reception from the noise-introducing channel, the redundant data is removed from the noisy encoded signal data and a denoiser that implements the DUDE+ method described above operates on the noisy signal data to generate reliability information. The reliability information and the noisy redundant data are then provided to a SISO decoder which generates enhanced reliability (i.e. probabilistic) information. This probabilistic information is expected to assume values in a real vector space, or simply the set of real numbers if the probabilistic information is expressed as likelihood ratios in the case of a binary input alphabet.

This probabilistic information may then be input to a subsequent signal processing system stage having a denoiser that implements the DUDE++ method described above to generate further enhanced probabilistic information. Thus, the input to this stage is treated as the noisy signal by the denoiser that implements the DUDE++ method. Error correction may also be performed in this subsequent stage on the further enhanced probabilistic information by a second SISO error correction decoder. The conditional probability sequence output of this subsequent stage may again be input to another subsequent stage system that implements the DUDE++ method described above and that possibly implements error correction, to generate still further enhanced probabilistic information. This process may be repeated recursively. Enhanced probabilistic information may then be converted into a recovered signal which is an estimate of the input signal before it passed through a noisy channel. This can be accomplished using the probabilistic information along with relative distortion information to select symbols with the lowest estimated distortion to be included in the recovered signal. It is expected that in certain circumstances such a system will provide improved performance over other denoising and decoding systems.

Figure 15:
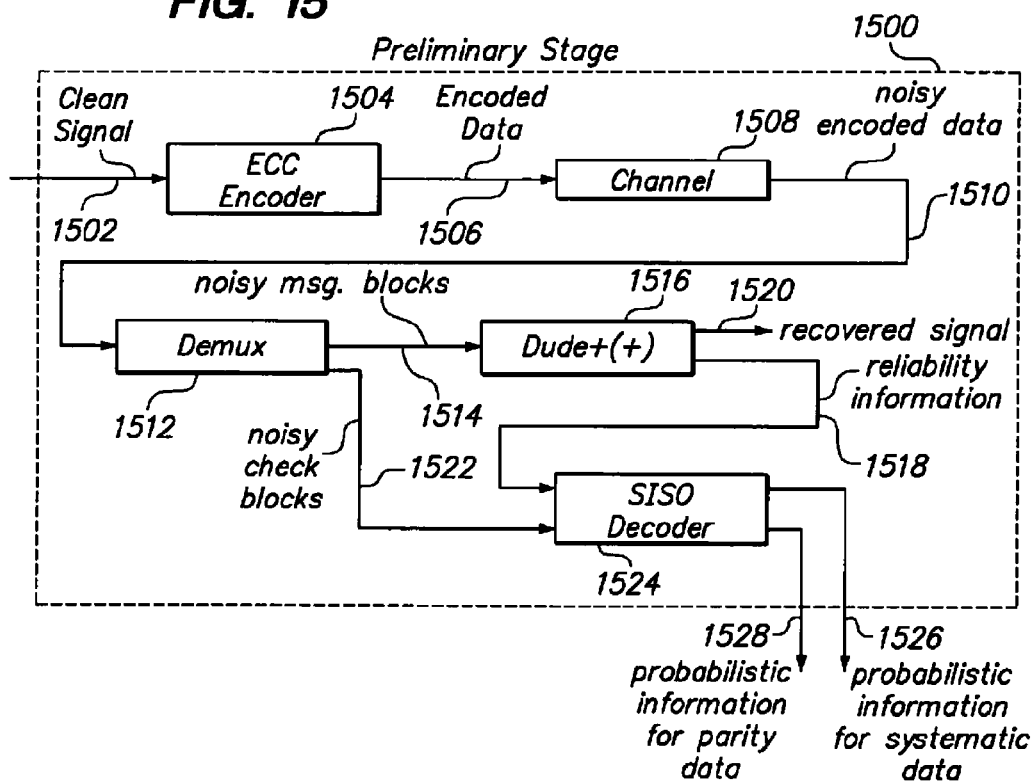
FIG. 15 illustrates a preliminary processing stage of a system for processing a noisy signal received from a noise-introducing channel including performing error correction in accordance with an embodiment of the present invention.

FIG. 15 illustrates a preliminary signal processing stage 1500 of a system for processing a noisy signal received from a noise-introducing channel including performing error correction in accordance with an embodiment of the present invention. As before, a clean original signal is represented as a sequence of symbols that are each members of an alphabet A having n distinct symbols. Prior to transmission via a noisy channel, the clean signal 1502 is passed through an ECC encoder 1504. The ECC encoder 1504 is an error correction encoder that employs systematic error correction coding to generate an encoded data signal 1506. The encoded data signal 1506 is then transmitted via a noise-introducing channel 1508. A noisy encoded data signal 1510 is produced by the noise-introducing channel 1508. This signal 1510 is then applied to a de-multiplexer 1512 which separates message blocks in each code word from redundant check blocks which were added by the encoder 1504. The processing stage 1500 may be implemented by hardware or by a combination of hardware and software.

Figure 16:
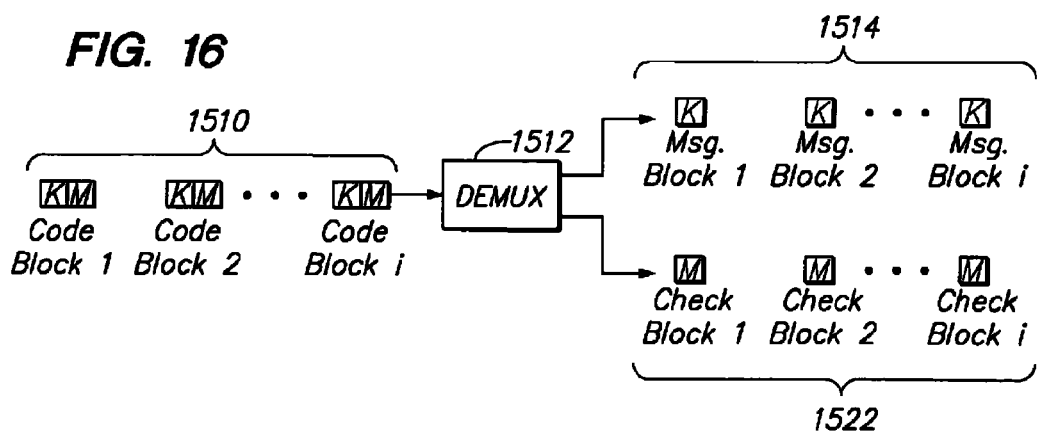
FIG. 16 illustrates operation of a de-multiplexer for use in an embodiment of the present invention.

FIG. 16 illustrates operation of the de-multiplexer 1512. As shown in FIG. 16, the noisy encoded signal 1510 includes a sequence of code blocks or words. Each code block includes a systematic portion corresponding to the original message labeled "K" and a redundant parity portion labeled "M" corresponding to the portion which was added by the encoder 1504. The de-multiplexer 1512 separates the code blocks into the "K" and "M" portions.

A noisy message block signal 1514 from the de-multiplexer 1512 is passed through a denoiser 1516 that performs the DUDE+ method described herein. Where a noise-introducing channel is a finite input, continuous output channel, the denoiser 1516 may perform the DUDE++ method described herein. The denoiser 1516 produces reliability information 1518. The denoiser 1516 may also produce a less noisy sequence of message blocks 1520. The data signal 1520 corresponds to the original clean signal 1502 after it has been passed through the noise introducing channel 1508 and the denoiser 1516. In an embodiment, this signal 1520 is not needed and, thus, need not be generated. For example, where the reliability information 1518 is output as a sequence of lists, each list being correlated in sequence to a particular symbol in the noisy signal, the noisy encoded data 1510, the noisy symbols 1514 or the less-noisy symbols 1520 need not be provided to decoder 1524. This is shown in FIG. 15. However, in an embodiment where the reliability information is output as lists that are not correlated in time or sequence to the particular symbols that occur in the noisy signal, then the noisy encoded data 1510, the noisy message symbols 1514 or the recovered signal 1520 may be provided to the decoder 1524 with appropriate modifications to the system of FIG. 15. In any case, the noisy check blocks 1522 are provided to the decoder 1524, though they may be included in the noisy encoded data 1510.

The noisy check blocks 1522 from the de-multiplexer 1512 are then passed to the decoder 1524, which comprises an appropriately configured, soft-input, soft-output decoder. The decoder 1524 uses the reliability information 1518 from the denoiser 1516 and the redundant data introduced by the encoder 1504 to perform error correction. The output of the decoder 1524 includes a probabilistic information signal 1526 corresponding to the systematic data. The probabilistic information 1526 output from the stage 1500 generally does not consist of symbols from the alphabet for the input signal 1502. Rather, this information is of a general or continuous alphabet. As such, the probabilistic information may be further processed by applying the signal 1526 to the denoiser 1300 of FIG. 13. The output of the decoder 1524 may also include a probabilistic information signal 1528 corresponding to the redundant data.

Figure 17:
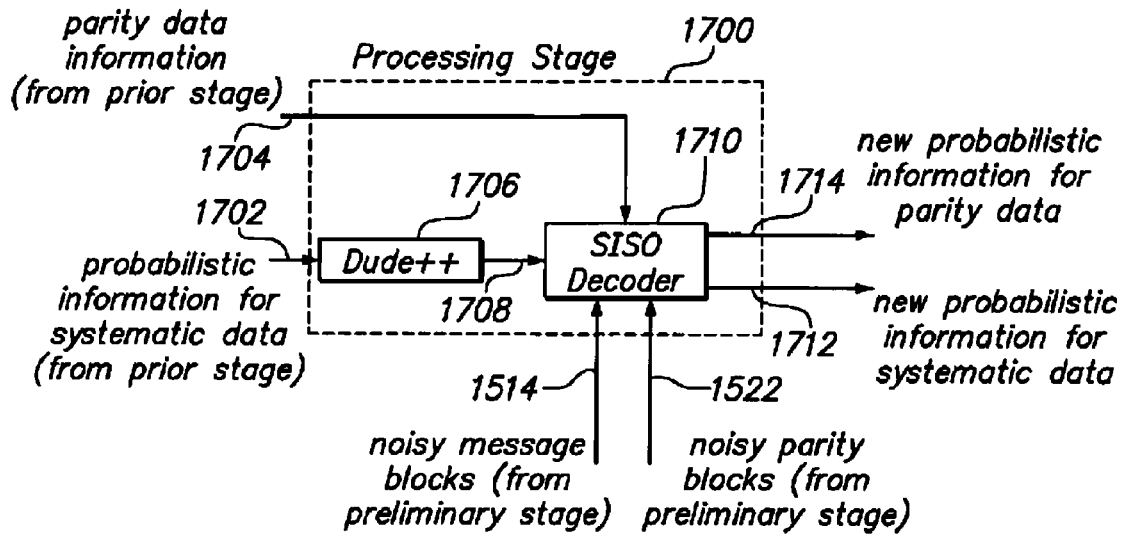
FIG. 17 illustrates a subsequent processing stage of a system for processing a noisy signal received from a finite input, general output channel including performing error correction in accordance with an embodiment of the present invention.

FIG. 17 illustrates a subsequent processing stage 1700 of a system for processing a signal received from a finite input, general output channel including performing error correction decoding in accordance with an embodiment of the present invention. The processing stage 1700 may be implemented by hardware or by a combination of hardware and software. The processing stage 1700 receives as input, probabilistic information 1702 for systematic data and redundant data information 1704. The probabilistic information for systematic data 1702 is applied to a denoiser 1706 that implements the DUDE++ method described herein. Thus, the denoiser 1706 accepts the signal 1702 and generates a signal 1708 including refined probabilistic information corresponding to systematic data, similar in form to the signal 1702.

The signal 1708 is applied to an appropriately configured soft-input soft-output decoder 1710, which uses the redundant data information 1704 and the signal 1708 to perform error correction decoding. In an embodiment, the redundant data information 1704 is in the form of probabilistic information corresponding to parity data. The decoder 1710 may also receive the noisy message blocks 1514 and the noisy check blocks 1522 from the preliminary processing stage 1500 (FIG. 15).

In some circumstances, the values determined by the DUDE++ method for the conditional probabilities may not be between zero and one, which can cause difficulties for the decoder 1710 since most soft-input decoders expect these values to be between zero and one. For example, the actual values may be negative, zero or one. To avoid this, the values computed according to:

$$(m^T(s_{noisy},b,c)\Pi^{-1})[a_x]\Pi(a_x, a_a) \text{ with } x=1, 2, \ldots, n$$

are preferably normalized and smoothed such that they are adjusted to be within the range of zero to one. In an embodiment for a binary alphabet, this may be accomplished by the following pseudocode:

(1) total=$1^T$ m($s_{noisy}$,b,c)
(2) c=0.25
(3) rdr=($m^T(s_{noisy}$,b,c)$\Pi^{-1}$)[1]/total
(4) rnr=($m^T(s_{noisy}$,b,c)$\Pi^{-1}$)[0]/total
(5) if (rnr<=0) rnr=0
(6) if (rdr<=0) rdr=0
(7) temp=min(rnr,rdr)
(8) temp=min(temp+c/sqrt(total),0.5)
(9) if (rnr<rdr) rnr=temp; else rnr=1-temp
(10) rdr=1-rnr In line (1) above, $1^T$=[1 1 1 ... 1] is the all ones vector so that a variable, total, is set equal to the sum of the components of m($s_{noisy}$,b,c). In line (2), a variable, c, is set equal to 0.25, though a different value may be selected. In line (3), a variable rdr set equal to the first vector component of ($m^T(s_{noisy}$,b,c) $\Pi^{-1}$)[$a_x$] divided by the variable, total. In line (4), a variable rnr is set equal the zero vector component of ($m^T(s_{noisy}$,b,c) $\Pi^{-1}$)[$a_x$] divided by the variable total. In line (5), the value of rnr is compared to zero and if it is less than zero, the value of rnr is set to zero. Similarly, in line (6), the value of rdr is compared to zero and if it is less than zero, the value of rdr is set to zero. The values rdr and rnr are, thus, fractions that are expected to be between zero and one and that are expected to be equal to one when summed together. However, if either of rnr or rdr is negative, it is set equal to zero. In line (7) and (8), a variable, temp, is set equal to the smaller of rnr and rdr plus a perturbation, but without allowing temp to exceed 0.5. In lines (9) and (10), the smaller of rnr and rdr is set equal to temp and the other is set equal to 1-temp.

Then, using the resulting values of rnr and rdr, the reliability information is as follows: (rdr)$\Pi(1, a_a)$ and (rnr)$\Pi(0, a_a)$ for the context b,c and "central" symbol $a_a$.

In another embodiment for a binary alphabet, the conditional probabilities may be adjusted to be within the range of zero to one by the following pseudocode:

(1) total=$1^T$m($s_{noisy}$,b,c)
(2) rnr=($m^T(s_{noisy}$,b,c)$\Pi^{-1}$)[0]/total
(3) temp=1/total;
(4) temp=min(temp,0.5);
(5) if (rnr<temp) rnr=temp; else if (rnr>1-temp) rnr=1-temp
(6) rdr =1-rnr In line (1) above, $1^T$=[1 1 1 ... 1] is the all ones vector so that a variable, total, is set equal to the sum of the components of m($s_{noisy}$,b,c). In line (2), a variable rnr set equal to the zero vector component of ($m^T(s_{noisy}$,b,c)$\Pi^{-1}$)[$a_x$] divided by the variable, total. In line (3), a variable temp is set equal to the inverse of total. In line (4), the variable temp is set equal to its former value or 0.5 whichever is less. In line (5), if rnr is less than temp, it is set equal to temp; otherwise, if rnr is greater than 1-temp, rnr is set equal to 1-temp. In line (6), rdr is set equal to 1-rnr. As before, using the resulting values of rnr and rdr, the reliability information is as follows: (rdr)$\Pi(1, a_a)$ and (rnr)$\Pi(0, a_a)$ for the context b,c and central symbol $a_a$.

It will be apparent that other techniques can be performed to adjust the reliability information to be within a specified range of values and that techniques can also be performed to adjust the reliability information to be within a specified range for data signals having larger alphabets than in the examples above.

These adjusted values can then be used to generate the probabilistic or reliability information (which could be in the form of likelihood ratios) for output.

The output of the decoder 1710 includes a probabilistic information signal 1712 corresponding to the systematic data. Due to the error correction decoding, the signal 1712 is expected to have probabilities placing greater weight on the correct symbols compared to the signal 1708. This output signal is similar in form to the output signal 1526 of the decoder 1524 of FIG. 15. In addition, output of the decoder 1710 may include a probabilistic information signal 1714 corresponding to the redundant data. This output signal is similar in form to the output signal 1528 of the decoder 1524 of FIG. 15.

Any number of additional subsequent stages, like the stage 1700, may be included in the system. The additional subsequent stages may be coupled in series with a first one of the subsequent stages coupled to receive the output of the stage 1700 so that the functions of the stage 1700 are performed recursively, further refining the results from each stage. Eventually, the enhanced probabilistic information output from a final stage may be converted into a recovered signal which is an estimate of the input signal before it passed through a noisy channel. This can be accomplished using the enhanced probabilistic information along with relative distortion information to select symbols with the lowest estimated distortion to be included in the recovered signal.

It should be noted that the DUDE+ and DUDE++ techniques can operate on the systematic portions (and reliabilities corresponding to systematic portions in the case of DUDE++) from more than one error correction code block at a time. For example, image data may broken up into numerous code blocks for error correction purposes, while the DUDE+ and DUDE++ algorithms ideally operate on the entire noisy image data aggregated into one signal, and not independently on the portions corresponding to the code blocks. Thus, there need not be a correspondence between the code block size and the amount of data that is operated on by the DUDE++ method. Because accuracy of the DUDE++ method is increased when the length of the signal is increased, the DUDE++ method may operate simultaneously on a plurality of the message blocks. Further, because all such message blocks must be received for the DUDE++ method to be applied to them, a tradeoff exists between the number of message blocks received before the DUDE++ method is applied and the time before DUDE++ output becomes available.

A parameter required by the DUDE++ algorithm at each denoising/decoding stage is the effective channel probability density function $f_i(y)$ characterizing the distribution of the continuous valued reliability information generated by the decoding operation of the previous stage for each possible value of the corresponding finite valued channel input symbol. In a preferred embodiment, this density information for each denoising/decoding stage is determined experimentally by executing the proposed denoising/decoding system up through the previous stage on numerous known training channel input signals and applying probability density estimation techniques to the reliability information generated at the output of the previous stage. The estimated $f_i(y)$ can then be used by the DUDE++ algorithm at the corresponding denoising/decoding stage in the deployed system.

The SISO decoding algorithms such as belief propagation and turbo decoding are iterative in nature and maintain an internal state that is updated in each iteration. For example, the internal state of the belief propagation algorithm, includes the likelihood messages most recently received by each check and variable node along each in-coming edge of the graphical model (Tanner graph) describing the LDPC code. Also part of the state is the current phase in the schedule of node updates. In addition, each iteration of the SISO decoder generally involves accessing a-priori reliability or probabilistic information about each systematic and parity code symbol as well as channel reliability information indicating the likelihood of the observed channel output for each possible corresponding input. The a-priori probabilistic information about each systematic and parity code symbol and channel reliability information forms part of the state of the decoder before the iterations commence. In certain implementations of iterative SISO decoding, the a-priori and channel reliability information associated with each codeword symbol is fixed across all iterations. In one embodiment of the present invention, the SISO decoder in each denoising/decoding processing stage 1700 (FIG. 17) is iterative and an arbitrary number iterations of are performed. The internal state of the decoding algorithm is preserved between denoising/decoding stages and the probabilistic output of each denoising phase (DUDE+ or DUDE++) of each denoising/decoding stage is used as the a-priori reliability information for the systematic codeword symbols in the decoding phase of that stage. The a-priori reliabilities for the parity symbols as well as the channel reliabilities for all symbols may be left unchanged from one denoising/decoding stage to the next or reset to an initial state.

First Alternative Embodiment for Iterative Denoising and Error Correction

In a first alternative embodiment for iterative denoising and error correction a denoiser generates reliability information for each (clean) input symbol by forming a product of reliability information received from a previous decoding operation and an estimate of the distribution of metasymbols in the input signal. The denoiser then determines a marginal distribution by summing the result over values for input context symbols corresponding to a particular input symbol. An error correction decoder performs error correction decoding using the generated reliability information. This approach to an iterative denoising/decoding algorithm assumes that the underlying error correcting code is systematic and involves iterating between a denoising stage targeting the systematic code symbols (which by definition are also the source symbols) and a soft-input-soft-output (SISO) error correction decoding algorithm.

Figure 18:
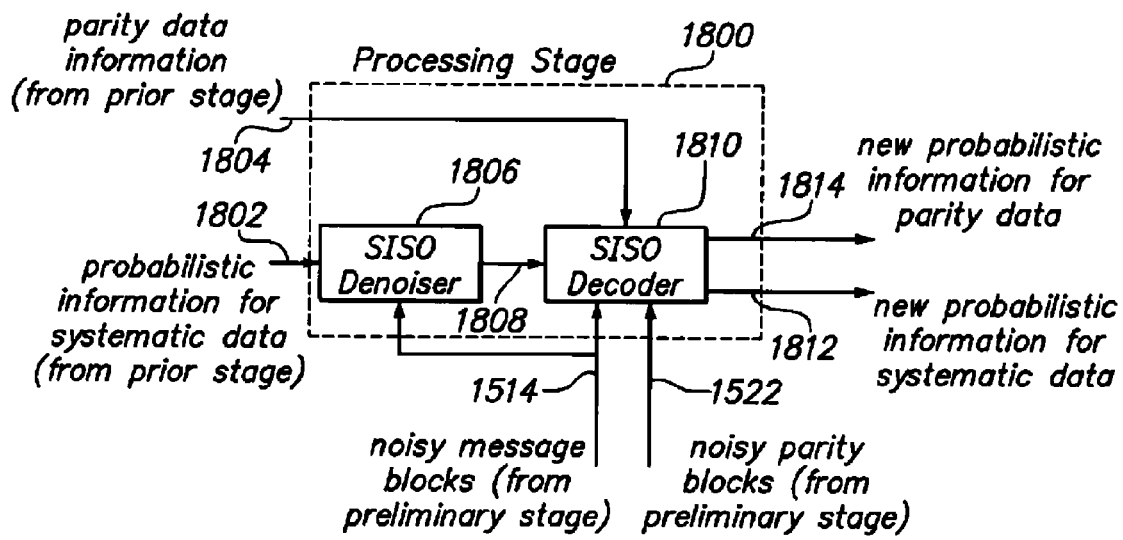
FIG. 18 illustrates an alternative processing stage for iterative denoising and error correction in accordance with an embodiment of the present invention.

FIG. 18 illustrates an alternative processing stage 1800 for iterative denoising and error correction in accordance with an embodiment of the present invention. The processing stage 1800 may be implemented by hardware or by a combination of hardware and software. This embodiment is similar to that of the embodiments shown in FIGS. 15-17 and described above, except that the DUDE++ denoiser 1706 shown in FIG. 17 is replaced with a soft-input, soft-output denoiser 1806, as shown in FIG. 18. Operation of the denoiser 1806 of FIG. 18 is explained herein.

As shown in FIG. 18, the processing stage 1800 receives as input probabilistic information 1802 for systematic data and redundant data information 1804. The probabilistic information for systematic data 1802 is applied to the denoiser 1806. The denoiser 1806 may also receive the noisy message blocks 1514. The denoiser 1806 generates a signal 1808 including refined probabilistic information corresponding to systematic data, similar in form to the signal 1802. The probabilistic information signal 1808 is applied to an appropriately configured soft-input soft-output decoder 1810, which uses the redundant data information 1804 and the signal 1808 to perform error correction decoding. In an embodiment, the redundant data information 1804 is in the form of probabilistic information corresponding to parity data. The decoder 1810 may also receive the noisy message blocks 1514 and the noisy check blocks 1522 from the preliminary processing stage 1500 (FIG. 15). The stage 1500 performs a first iteration of denoising and decoding. Any number of iterations of denoising and error correction may be performed by the stage 1800.

The error correction decoding algorithm performed by the decoder 1810 is assumed to take as input some reliability information about each systematic symbol and each redundant parity symbol, as shown by the signals 1804 and 1808 in FIG. 18. This reliability information for each code word including a systematic and parity symbol may have two parts: a conditional probability distribution on channel output symbol values given each input value (e.g., the channel transition probabilities Π) and an a-priori probability distribution on the values each codeword symbol takes on, denoted by $p_{x_i}(x)$, for x equal to any value in the symbol alphabet A. These two reliability indicators can be combined by the decoder 1810 to obtain a conditional probability distribution on the values that the i-th symbol takes on given all possible values of the corresponding channel output, denoted by $p_{X_i|Z_i}(x|z)$. A SISO error correction decoding algorithm transforms the input probability and channel reliability information into an aggregate reliability information for each symbol of the transmitted code word, denoted for the i-th symbol, by $q_{X_i|Z}(x|z)$, for x equal to any value in the symbol alphabet A. The aggregate reliability information for the i-th symbol can be interpreted as a probability distribution on the values that this symbol might take on given the entire (or significant portions of) received, channel corrupted codeword.

In an approach lacking the denoising stage of the present invention, the input symbol distributional parameters $p_{X_i}(x)$ supplied to a decoder can be the uniform distribution on the values that the i-th symbol takes on. In the case that the symbol-transformation distortion matrix $\Lambda$ reflects the Hamming loss, each systematic symbol is decoded to the value $\hat{x}$ maximizing $q_{X_i|Z}(x|z)$, or, in other words, the a-posteriori likeliest symbol value. More generally, each symbol is decoded to the value $\hat{x}$ minimizing the expected loss relative to x distributed according to $q_{X_i|Z}(x|z)$, or minimizing the expression $$\sum_{x \in A} \Lambda(x, \hat{x}) q_{X_i|Z}(x|z).$$

A system in accordance with the present embodiment of the invention performs one or more iterations by the denoising stage 1806 and the decoding stage 1810. The t-th denoising stage takes as input aggregate reliability information from the (t−1)-th decoding stage to generate the t-th stage a-priori reliability distribution $p_{X_i}^{(t)}(x)$, for each systematic symbol. The decoding algorithm then continues into a t-th stage, with its internal state preferably preserved from the previous iteration, but with the t-th stage a-priori reliability distributions replacing the set of distributional parameters $p_{X_i}(x)$ described above, for the systematic symbols. The corresponding parameters for the non-systematic symbols are left unchanged. The t-th decoding stage generates the t-th stage aggregate reliability information $$q_{X_i|Z}^{(t)}(x|z),$$

which in turn is fed to the t+1-th denoising stage. The initial a-priori reliability information $p_{X_i}^{(1)}(x)$ for the systematic symbols is essentially the output of the DUDE+ algorithm disclosed herein. The a-priori reliability information differs from the DUDE+ output in that the channel transition probability matrix $\Pi(a_x, a_a)$ is preferably not incorporated. Instead, the decoder accounts for channel matrix through multiplication, though this multiplication could be performed by the denoiser, the decoder or another entity. Correspondingly, the initial a-priori reliability information $$p_{X_i}^{(1)}(x)$$

for the non-systematic symbols is the uniform distribution, as would be assumed by the SISO decoder in absence of a denoiser.

The denoising stage 1806 for iterations after the initial DUDE+ stage 1500 determines an estimate of the probability distribution on values assumed by contextual neighborhoods of clean source (equivalently, systematic or input) symbols. This distribution is estimated using a matrix inversion method operating on probabilities for contextual neighborhoods (i.e., metasymbols), similarly to the DUDE algorithm described herein. Each systematic symbol for each index i has a neighborhood associated with it consisting of symbols with indices in $N_i$, containing the symbol with index i itself. The neighborhoods are assumed to all be of size k. Note that when the disclosed system is operating on a large signal, such as a high resolution digital image or video, that has been encoded into a plurality of codewords, the neighborhood of a particular symbol may include systematic symbols belonging to codewords different from that associated with the particular symbol. Thus neighborhoods may consist of symbols from multiple codewords. A one to one mapping defined for each $N_i$, $K_{N_i}(j)$ maps each index j in $N_i$ to a value 1 through k specifying the "location" of the corresponding index in the neighborhood. We assume, for convenience, that $K_{N_i}(i)=k$. Let $K_{N_i}^{-1}(j)$ denote the inverse map. For each k tuple of symbol values let $m(z_1, z_2, \ldots, z_k)$ denote the fraction of neighborhoods $N_i$ in the noisy systematic portion of all or some of the received codewords (in case the signal was encoded into a plurality of codewords) in which the symbols with indices $K_{N_i}^{-1}(1), \ldots, K_{N_i}^{-1}(k)$ take on the corresponding values $z_1, z_2, \ldots, z_k$. An estimate $\hat{p}(x_1, x_2, \ldots, x_k)$ of the fraction of neighborhoods in the clean source symbols taking on the values $x_1, x_2, \ldots, x_k$, for all such k-tuples, can be derived from the m distribution, in k steps, as follows. For any function $f$ on k-tuples of symbol values (such as m and $\hat{p}$ just defined) let $f_j(z_1, z_2, \ldots, z_{j-1}, z_{j+1}, \ldots, z_k)$ denote the vector:

$$\begin{bmatrix} f(z_1, z_2, \ldots, z_{j-1}, a_1, z_{j+1}, \ldots, z_k) \\ f(z_1, z_2, \ldots, z_{j-1}, a_2, z_{j+1}, \ldots, z_k) \\ f(z_1, z_2, \ldots, z_{j-1}, a_3, z_{j+1}, \ldots, z_k) \\ \vdots \\ f(z_1, z_2, \ldots, z_{j-1}, a_n, z_{j+1}, \ldots, z_k) \end{bmatrix}$$

Set $\hat{p}_1^{(1)}(z_2, \ldots, z_k) = m_1(z_2, \ldots, z_k)$ and for $j=2, \ldots, k$ and all k−1-tuples of j−1 input symbols followed by k−j output symbols (e.g., $x_1, x_2, \ldots, x_{j-1}, z_{j+1}, \ldots, z_k$) compute $\hat{p}_j^{(j)}(x_1, x_2, \ldots, x_{j-1}, z_{j+1}, \ldots, z_k) = \text{Smooth}([\Pi^{-1}]^T \hat{p}_j^{(j-1)}(x_1, x_2, \ldots, x_{j-1}, z_{j+1}, \ldots, z_k))$ and set $\hat{p}(x_1, x_2, \ldots, x_k) = \hat{p}_k^{(k)}(x_1, x_2, \ldots, x_{k-1})[x_k]$. The smoothing operation Smooth(.) ensures that all of the components of $\hat{p}_j^{(j)}(x_1, x_2, \ldots, x_{j-1}, z_{j+1}, \ldots, z_k)$ are non-negative and have the same sum as the components of $\hat{p}_j^{(j-1)}(x_1, x_2, \ldots, x_{j-1}, z_{j+1}, \ldots, z_k)$. In the binary case, either of the two smoothing techniques disclosed above may be used. These techniques assume that the component sums are 1, but can be extended to this case by sandwiching them between normalization and denormalization steps.

In an alternative embodiment, the estimated distribution $\hat{p}(x_1, x_2, \ldots, x_k)$ of input metasymbols can be derived from a hard decision decoded signal obtained by decoding the symbol with index i to the input value x in the alphabet A maximizing $$q_{X_i|Z}^{(t-1)}(x|z),$$

to obtain the likeliest value. This sequence of symbols or signal may be denoted by $\hat{z}^{(t-1)} = \hat{z}_1, \hat{z}_2, \ldots, \hat{z}_N$, and may comprise hard decision decoded symbols from multiple codewords if the input signal to the disclosed system was encoded into a plurality of codewords. The estimated distribution $\hat{p}(x_1, x_2, \ldots, x_k)$ evaluated at $x_1, x_2, \ldots, x_k$ can then be set to the fraction of metasymbols or contextual neighborhoods in the signal $\hat{z}^{(t-1)}$ whose symbols take on the values $x_1, x_2, \ldots, x_k$. It may be preferable to add a small offset such as 1/N where N is the length of the signal $\hat{z}^{(t-1)}$ to each resulting $\hat{p}(x_1, x_2, \ldots, x_k)$ and then normalizing to obtained an adjusted estimated probability distribution $\hat{p}(x_1, x_2, \ldots, x_k)$ on input metasymbols for use in the subsequent processing steps.

We now describe how the t-th denoising stage uses the estimated probability distribution $\hat{p}(x_1, x_2, \ldots, x_k)$ and the outputs of the t−1-th decoding stage $$q^{(t-1)}_{X_i|Z}(x \mid z)$$

to generate the t-th stage a-priori reliability information $p_{X_i}^{(t)}(x)$. Let $$\tilde{q}^{(t-1)}_{Z|X_i}(z \mid x) = \frac{q^{(t-1)}_{X_i|Z}(x \mid z)}{p^{(t-1)}_{X_i}(x)}.$$

This step removes intrinsic information from the reliability information output by the prior stage decoder to form adjusted reliability information.

Then, for each systematic symbol index i, corresponding neighborhood $N_i$, and each value x in the symbol alphabet A, let $$\tilde{p}^{(t)}_{X_i}(x) = \sum_{x_1 \ldots x_{k-1}} \hat{p}(x_1, \ldots, x_{k-1}, x) \prod_{j=1}^{k-1} \tilde{q}^{(t-1)}_{Z|X_{K_{N_i}^{-1}(j)}}\left(z \mid x_{K_{N_i}^{-1}(j)}\right),$$

where the summation is over all or some of the values that the neighborhood or context symbols can take on. This forms a summation of a product of the estimate of the probability distribution of metasymbols in the input signal and reliability information received from a prior decoding operation. This step marginalizes the input context symbols in each metasymbol using the estimated distribution of clean symbols $\hat{p}(x_1, x_2, \ldots, x_k)$ and the adjusted reliability information $$\tilde{q}^{(t-1)}_{Z|X_i}(z \mid x).$$

Then, set $$p^{(t)}_{X_i}(x) = \frac{\tilde{p}^{(t)}_{X_i}(x)}{\sum_x \tilde{p}^{(t)}_{X_i}(x)}.$$

This t-th stage a-priori reliability information $p_{X_i}^{(t)}(x)$, for each value of x in the symbol alphabet A, generated by the t-th stage denoiser 1806 is then provided to the t-th stage decoder 1810.

The internal state of the t-th stage of the decoder 1810 is preferably preserved from the (t-1)-th stage, except that the probabilistic output $p_{X_i}^{(t)}(x)$ of the t-th stage of the denoiser 1806 replaces the a-priori reliability information for the systematic codeword symbols in the t-th stage decoding algorithm. The a-priori reliabilities for the parity symbols as well as the channel reliabilities for all symbols are left unchanged from one denoising/decoding stage to the next.

Alternatively, rather than preserving the internal state of the t-th stage of the decoder 1810 from the (t-1)-th stage, the internal state of the decoder 1810 may be reset to an initial state. As before, the a-priori reliability information for the systematic codeword symbols is replaced by the probabilistic output $p_{X_i}^{(t)}(x)$ of the t-th stage of the denoiser 1806.

Note that in a system in which the input signal is encoded into a plurality of codewords or code blocks, the denoising stage in general generates reliability information for the i-th system input symbol (symbol with index i) using noisy systematic symbols and decoder generated reliability information corresponding to possibly many codewords and not just the codeword containing the i-th symbol.

Thus, a first alternative embodiment for iterative denoising and error correction has been described. In a preferred embodiment, binary sources, systematic low density parity check (LDPC) codes such as Repeat Accumulate codes, and belief propagation decoding algorithm for LDPC codes are employed in the first alternative embodiment.

Second Alternative Embodiment for Iterative Denoising and Error Correction

The first alternative embodiment described above has the drawback that the error correction decoding stage is not being utilized to refine $\hat{p}(.)$, the estimate of the distribution of clean source symbols. Thus, in an alternative embodiment, the error correction decoding stage is utilized to refine the estimate of the distribution of clean source symbols. Like the previous embodiment, this embodiment sequentially performs iterations using a denoising stage followed by a decoding stage. The denoiser generates reliability information for symbols in the input signal by forming a hard-decision decoded signal from reliability information received from a previous decoding operation, determines metasymbol counts for the hard-decision decoded signal and solves an equation which may be quadratic and whose coefficients are obtained from the received reliability information and the metasymbol counts. Like the previous approach, a first iteration includes a run of the DUDE+ algorithm in a preliminary stage 1500 (FIG. 15) followed by the corresponding error correction decoding stage 1800 (FIG. 18), as described herein. Subsequent iterations differ from the iterations of the previously described approach only in how the denoising stage 1806 processes the aggregate reliability information $q_{X_i|Z}^{(t-1)}(x|z)$ to generate the new a-priori reliability information $p_{X_i}^{(t)}(x)$. In this embodiment, it is assumed that the input and output alphabets are binary such as A={0,1}.

First, a hard decision decoded sequence of source symbols is obtained by decoding the symbol with index i to the value x in the alphabet A maximizing $$q^{(t-1)}_{X_i|Z}(x \mid z).$$

This sequence of symbols may be denoted by $\hat{z}^{(t-1)} = \hat{z}_1, \hat{z}_2, \ldots, \hat{z}_N$, (and may comprise hard decision decoded symbols from multiple codewords if the input signal to the disclosed system was encoded into a plurality of codewords).

Next, the fraction of occurrences of each neighborhood of symbols (i.e., each metasymbol) in the decoded sequence $\hat{z}^{(t-1)}$ for which the "center" symbol (i.e., the current symbol of interest) takes on each possible value x, is determined. This is accomplished by determining metasymbol counts for the hard-decision decoded signal. The result is equivalent to the normalized $m(\hat{z}^{(t-1)}, \eta)$ vector described herein in reference to DUDE, or to a normalized $m_k(x_1, \ldots, x_{k-1})$ vector defined above.

For each i, $p_{Z_i}(x)$ may denote $m(\hat{z}^{(t-1)}, \eta_i)[x]$ where $\eta_i$ represents the value of the context of the i-th symbol in $\hat{z}^{(t-1)}$, the hard decision decoded signal. Then, for each i, solve the following quadratic equation for $p(X=\hat{z}_i)$:

$$p(X = \hat{z}_i) = p(X = \hat{z}_i \mid Z = \hat{z}_i)p(Z = \hat{z}_i) +$$
$$[1 - p(X = \hat{z}_i \mid Z = \hat{z}_i)]p(Z = \hat{z}_i)\frac{p(X = \hat{z}_i)}{1 - p(X = \hat{z}_i)}$$

where $p(Z = \hat{z}_i) = p_{Z_i}(\hat{z}_i)$ and $p(X = \hat{z}_i \mid Z = \hat{z}_i) = q_{X_i \mid Z}^{(t-1)}(\hat{z}_i \mid z)$.

Then, set $p_{X_i}^{(t)}(x) = p(X=x)$ so obtained for $x=\hat{z}_i$ and set $p_{X_i}^{(t)}(1-\hat{z}_i) = 1 - p_{X_i}^{(t)}(\hat{z}_i)$. This quadratic equation is derived using the assumption that the random variable Z corresponds to the random variable X corrupted by a binary symmetric channel with a crossover probability determined implicitly by the above specified quantities $p(Z=\hat{z}_i)$ and $p(X=\hat{z}_i \mid Z=\hat{z}_i)$. Coefficients for the quadratic equation are thus obtained from the reliability information received from the previous decoding operation and from the metasymbol counts.

Solving the quadratic equation forms the reliability information $p_{X_i}^{(t)}(x)$, for $x=0, 1$, that is then passed to the decoder 1810. In an alternative embodiment the reliability information for $x=0, 1$, may simply be set so that $p_{X_i}^{(t)}(x) = p_{Z_i}(x)$, with $p_{Z_i}(x)$ determined as above, thereby skipping the step of solving the quadratic equation. Preferably, a smoothing operation is performed on the results prior to being passed to the decoder. This smoothing operation preferably constrains the resulting values to be greater than zero and less than one.

Also, solving the quadratic equation generally results in two possible solutions. It is preferable to choose a solution which is greater than zero and smaller than one. If both solutions satisfy this then a first solution corresponds to an implicit binary symmetric channel having a cross-over probability smaller than the cross-over probability of an implicit binary symmetric channel corresponding to a second solution. Preferably, the first solution is selected for the generated reliability information since this solution assumes that the channel is reasonably clean in that its cross-over probability is small. If the solution is imaginary then $p_{X_i}^{(t)}(x)$ can be set to $$q_{X_i \mid Z}^{(t-1)}(x \mid z)$$

or to $p_{Z_i}(x)$, for $x=0, 1$.

As in the previous embodiment, the internal state of the t-th stage of the decoder 1810 is preferably preserved from the (t-1)-th stage, except that the probabilistic output $p_{X_i}^{(t)}(x)$ of the t-th stage of the denoiser 1806 replaces the a-priori reliability information for the systematic codeword symbols in the t-th stage decoding algorithm. The a-priori reliabilities for the parity symbols as well as the channel reliabilities for all symbols are left unchanged from one denoising/decoding stage to the next.

Alternatively, rather than preserving the internal state of the t-th stage of the decoder 1810 from the (t-1)-th stage, the internal state of the decoder 1810 may be reset to an initial state. As before, the a-priori reliability information for the systematic codeword symbols is replaced by the probabilistic output $p_{X_i}^{(t)}(x)$ of the t-th stage of the denoiser 1806.d Thus, a second alternative embodiment for iterative denoising and error correction has been described. In a preferred embodiment, binary sources, systematic low density parity check (LDPC) codes such as Repeat Accumulate codes, and belief propagation decoding algorithm for LDPC codes are employed in the second alternative embodiment. As in the first alternative embodiment, the stage 1500 performs a first iteration of denoising and decoding. Any number of iterations of denoising and error correction may be performed by the stage 1800 in accordance with the second alternative embodiment.

Approaches described herein for denoising using error correction are described in E. Ordentlich, G. Seroussi, S. Verdú, K. Viswanathan, M. J. Weinberger, and T. Weissman, "Channel Decoding of Systematic Encoded Unknown Redundant Sources," pub. 2004, the entire contents of which are hereby incorporated by reference.

The foregoing description, for purposes of explanation, used specific nomenclature to provide a thorough understanding of the invention. However, it will be apparent to one skilled in the art that the specific details are not required in order to practice the invention. The foregoing descriptions of specific embodiments of the present invention are presented for purpose of illustration and description. They are not intended to be exhaustive or to limit the invention to the precise forms disclosed. Obviously many modifications and variations are possible in view of the above teachings. The embodiments are shown and described in order to best explain the principles of the invention and its practical applications, to thereby enable others skilled in the art to best utilize the invention and various embodiments with various modifications as are suited to the particular use contemplated. It is intended that the scope of the invention be defined by the following claims and their equivalents:

What is claimed is:

1. A system comprising:
a denoiser that receives a noisy signal formed by a noise-introducing channel in response to an error correction coded input signal and for generating reliability information for symbols in the input signal, said generating comprising for a particular input symbol forming a product of received reliability information and an estimate of the distribution of metasymbols in the input signal, each metasymbol including context symbols and a corresponding symbol, and summing over values for the context symbols corresponding to the particular input symbol; and
an error correction decoder for performing error correction decoding using the generated reliability information.

2. The system according to claim 1, wherein for each of a plurality of iterations of processing, the denoiser generates reliability information and the decoder performs error correction decoding to form new reliability information.

3. The system according to claim 2, wherein the new reliability information for an iteration of processing comprises the received reliability information used by the denoiser for performing a next iteration of processing.

4. The system according to claim 3, wherein the reliability information generated by the decoder for each iteration updates a-priori reliability information for systematic symbols for use by the decoder.

5. The system according to claim 4, wherein parameters for an internal state of the decoder other than the a-priori reliability information for systematic symbols are unchanged between iterations of the denoiser generating reliability information and the decoder performing error correction decoding.

6. The system according to claim 4, wherein parameters for an internal state of the decoder other than the a-priori reliability information for systematic symbols are reset between iterations of the denoiser generating reliability information and the decoder performing error correction decoding.

7. The system according to claim 1, further comprising a preliminary processing stage that performs an iteration of soft output denoising and soft input, soft output error correction decoding on a signal received from the noise-introducing channel.

8. The system according to claim 7, wherein the preliminary processing stage comprises a preliminary stage denoiser and wherein the preliminary stage denoiser counts occurrences of metasymbols in the noisy signal, a portion of each metasymbol providing a context for a symbol of the metasymbol and, for each metasymbol occurring in the noisy message blocks, determines preliminary stage reliability information from the counts obtained by the preliminary stage denoiser and from symbol-transition probabilities for the noise-introducing channel.

9. The system according to claim 1, wherein the estimate of the distribution of metasymbols in the input signal is determined by performing successive steps of matrix inversion to obtain a joint distribution of j input symbols and k-j output symbols and wherein for each step the value of j is advanced by one until j is equal to k, wherein k is the size of the metasymbol.

10. The system according to claim 9, wherein a smoothing operation is performed at each step of matrix inversion.

11. The system according to claim 1, wherein the estimate of the distribution of metasymbols in the input signal is derived from occurrence counts of metasymbols in a hard decision decoded signal formed from received reliability information.

12. A system comprising:
a denoiser that receives a noisy signal formed by a noise-introducing channel in response to an error correction coded input signal and for generating reliability information for symbols in the input signal, said generating comprising forming a hard-decision decoded signal from received reliability information, determining metasymbol counts for the hard-decision decoded signal and solving an equation whose coefficients are obtained from the received reliability information and the metasymbol counts; and
an error correction decoder for performing error correction decoding using the generated reliability information.

13. The system according to claim 12, wherein the equation is quadratic.

14. The system according to claim 12, wherein for each of a plurality of iterations of processing, the denoiser generates reliability information and the decoder performs error correction decoding to form new reliability information.

15. The system according to claim 14, wherein the new reliability information for an iteration of processing comprises the received reliability information used by the denoiser for performing a next iteration of processing.

16. The system according to claim 15, wherein the reliability information generated by the decoder for each iteration updates a-priori reliability information for systematic symbols for use by the decoder.

17. The system according to claim 16, wherein parameters for an internal state of the decoder other than the a-priori reliability information for systematic symbols are unchanged between iterations of the denoiser generating reliability information and the decoder performing error correction decoding.

18. The system according to claim 16, wherein parameters for an internal state of the decoder other than the a-priori reliability information for systematic symbols are reset between iterations of the denoiser generating reliability information and the decoder performing error correction decoding.

19. The system according to claim 12, further comprising a preliminary processing stage that performs an iteration of soft output denoising and soft input, soft output error correction decoding on a signal received from the noise-introducing channel.

20. The system according to claim 19, wherein the preliminary processing stage comprises a preliminary stage denoiser and wherein the preliminary stage denoiser counts occurrences of metasymbols in the noisy signal, a portion of each metasymbol providing a context for a symbol of the metasymbol and, for each metasymbol occurring in the noisy message blocks, determines preliminary stage reliability information from the counts obtained by the preliminary stage denoiser and from symbol-transition probabilities for the noise-introducing channel.

21. The system according to claim 12, further comprising performing a smoothing operation on the reliability information generated by solving the quadratic equation.

22. The system according to claim 12, wherein solving the quadratic equation results in a first solution corresponding to an implicit binary symmetric channel having a smaller crossover probability and a second solution corresponding to an implicit binary symmetric channel having a greater crossover probability and wherein the first solution is selected for the generated reliability information.

23. A method of iteratively processing a noisy signal formed by a noise-introducing channel in response to an error correction coded input signal comprising receiving the noisy signal and for an iteration, performing steps of:
generating reliability information for symbols in the input signal, said generating comprising for a particular input symbol forming a product of received reliability information and an estimate of the distribution of metasymbols in the input signal, each metasymbol including context symbols and a corresponding symbol, and summing over values for the context symbols corresponding to the particular input symbol; and
performing error correction decoding using the generated reliability information.

24. The method according to claim 23, wherein the estimate of the distribution of metasymbols in the input signal is determined by performing successive steps of matrix inversion to obtain a joint distribution of j input symbols and k-j output symbols and wherein for each step the value of j is advanced by one until j is equal to k and wherein k is the size of the metasymbol.

25. The system according to claim 24, wherein a smoothing operation is performed at each step of matrix inversion.

26. A method of iteratively processing a noisy signal formed by a noise-introducing channel in response to an error correction coded input signal comprising receiving the noisy signal and for an iteration, performing steps of:
generating reliability information for symbols in the input signal, said generating comprising forming a hard-decision decoded signal from received reliability information, determining metasymbol counts for the hard-decision decoded signal and solving an equation whose coefficients are obtained from the received reliability information and the metasymbol counts; and performing error correction decoding using the generated reliability information.

27. The method according to claim 26, wherein the equation is quadratic.

28. The method according to claim 26, further comprising performing a smoothing operation on the reliability information generated by solving the quadratic equation.

29. The method according to claim 27, wherein solving the quadratic equation results in a first solution corresponding to an implicit binary symmetric channel having a smaller crossover probability and a second solution corresponding to an implicit binary symmetric channel having a greater crossover probability and further comprising selecting the first solution for the generated reliability information.

30. A system comprising:
a de-multiplexer that receives a noisy error correction coded signal formed by a noise-introducing channel in response to an error correction coded input signal and for separating noisy message blocks from noisy check blocks in the noisy error correction coded signal;
a first denoiser, wherein for each metasymbol occurring in the noisy message blocks, the denoiser determines first reliability information, the first reliability information representing a probability that the value in the input signal corresponding to the symbol of the metasymbol assumed, each of the possible values; and
a first error correction decoder for performing error correction decoding and generating a first refined reliability information using the noisy check blocks and the first reliability information generated by the first denoiser;
a second denoiser for generating second reliability information for symbols in the input signal, said generating comprising forming a hard-decision decoded signal from the first refined reliability information and determining metasymbol counts for the hard-decision decoded signal; and
a second error correction decoder for performing error correction decoding and generating a second refined reliability information using the second reliability information from the second denoiser.

31. The system according to claim 30, wherein the second denoiser and the second error correction decoder perform a plurality of successive iterations of processing.

32. The system according to claim 30, wherein the second reliability information comprises the metasymbol counts and a conditional distribution of values that a symbol in the hard-decision decoded signal takes on for a particular context, the context being a portion of a metasymbol.

33. A method of denoising and decoding a noisy error correction coded signal received through a noise-introducing channel, the method comprising:
receiving the noisy error correction coded signal from the noise-introducing channel;
separating noisy message blocks from noisy check blocks in the noisy error correction coded signal;
determining first reliability information for each metasymbol occurring in the noisy message blocks, the first reliability information being in machine readable form and representing a probability that the value in the input signal corresponding to the symbol of the metasymbol assumed each of the possible values;
performing error correction decoding using the noisy check blocks and the first reliability information, thereby generating first refined reliability information;
generating second reliability information for symbols in the input signal, said generating comprising forming a hard-decision decoded signal from the first refined reliability information and determining metasymbol counts for the hard-decision decoded signal; and
performing error correction decoding using the second reliability information, thereby generating second refined reliability information.

34. The method according to claim 33, further comprising performing a plurality of successive iterations of said generating second reliability information and said performing error correction decoding using the second reliability information.

35. The method according to claim 33, wherein the second reliability information comprises the metasymbol counts and a conditional distribution of values that a symbol in the hard-decision decoded signal takes on for a particular context, the context being a portion of a metasymbol.

36. A computer readable medium comprising computer code for implementing a method of iteratively processing a noisy signal formed by a noise-introducing channel in response to an error correction coded input signal the method comprising receiving the noisy signal and for an iteration, performing steps of:
generating reliability information for symbols in the input signal, said generating comprising for a particular symbol forming a product of received reliability information and an estimate of the distribution of metasymbols in the input signal, each metasymbol including context symbols and a corresponding symbol, and summing over values for context symbols corresponding to the particular symbol; and
performing error correction decoding using the generated reliability information.

37. A computer readable medium comprising computer code for implementing a method of iteratively processing a noisy signal formed by a noise-introducing channel in response to an error correction coded input signal the method comprising receiving the noisy signal and for an iteration, performing steps of:
generating reliability information for symbols in the input signal, said generating comprising forming a hard-decision decoded signal from received reliability information, determining metasymbol counts for the hard-decision decoded signal and solving a quadratic equation for which coefficients are obtained from the received reliability information and the metasymbol counts; and
performing error correction decoding using the generated reliability information.

38. A computer readable medium comprising computer code for implementing a method of denoising and decoding a noisy error correction coded signal received through a noise-introducing channel, the method comprising:
receiving the noisy error correction coded signal from the noise-introducing channel;
separating noisy message blocks from noisy check blocks in the noisy error correction coded signal;
determining first reliability information for each metasymbol occurring in the noisy message blocks, the first reliability information being in machine readable form and representing a probability that the value in the input signal corresponding to the symbol of the metasymbol assumed each of the possible values;
performing error correction decoding using the noisy check blocks and the first reliability information, thereby generating first refined reliability information;

generating second reliability information for symbols in the input signal, said generating comprising forming a hard-decision decoded signal from the first refined reliability information and determining metasymbol counts for the hard-decision decoded signal; and performing error correction decoding using the second reliability information, thereby generating second refined reliability information.

* * * * *